United States Patent [19]

Yoshizawa et al.

[11] Patent Number: 5,013,633
[45] Date of Patent: May 7, 1991

[54] METHOD FOR DEVELOPING A SILVER HALIDE COLOR PHOTOGRAPHIC LIGHT-SENSITIVE MATERIAL FOR COLOR PROOF USING A SPECIFIED COLOR DEVELOPING AGENT

[75] Inventors: Tomomi Yoshizawa; Keiji Ogi; Nariko Kimura, all of Hino, Japan

[73] Assignee: Konica Corporation, Tokyo, Japan

[21] Appl. No.: 374,469

[22] Filed: Jun. 30, 1989

[30] Foreign Application Priority Data

Jul. 4, 1988 [JP] Japan .................................. 63-167073

[51] Int. Cl.$^5$ .......................... G03C 7/00; G03C 5/24; G03C 7/32
[52] U.S. Cl. ..................................... 430/358; 430/264; 430/265; 430/268; 430/434; 430/464; 430/467; 430/558
[58] Field of Search ............... 430/264, 265, 268, 434, 430/464, 467, 558, 358

[56] References Cited

U.S. PATENT DOCUMENTS

| 4,639,413 | 1/1987 | Kawagishi et al. | 430/546 |
| 4,705,745 | 11/1987 | Kitchin et al. | 430/505 |
| 4,910,126 | 3/1990 | Sato et al. | 430/546 |

*Primary Examiner*—Charles J. Bowers, Jr.
*Assistant Examiner*—Patrick Doody
*Attorney, Agent, or Firm*—Jordan B. Bierman

[57] ABSTRACT

A method of preparing a color proof from a silver halide color photographic light-sensitive material and a black-and-white halftone dot image is disclosed, wherein said light-sensitive material has on a support the photographic component layers including silver halide emulsion layers each having different spectral sensitivities, and one of said silver halide emulsion layers comprises a magenta coupler represented by Formula M-I;

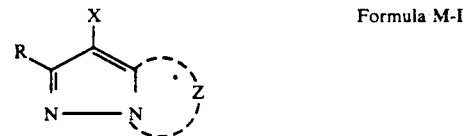

Formula M-I wherein Z represents a group of non-metal atoms necessary to form a nitrogen-containing heterocyclic ring including a substituted one; X represents one selected from the group consisting of a hydrogen atom and a group capable of splitting off upon a reaction with an oxidized product of a developer; and R represents one selected from the group consisting of a hydrogen atom and a substituent. The method comprises the steps of:

exposing said light-sensitive material through said halftone dot image, and,
  developing said exposed light-sensitive material in a developing solution containing a developer represented by Formula (III) in a ratio of not less than 55 mol % to total developers, to form at least a magenta image comprising $\lambda_{L0.2}$ of a spectral absorption in a wavelength region of 580 to 635 nm;

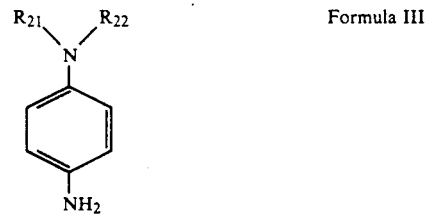

Formula III wherein $R_{21}$ and $R_{22}$ represent independently an alkyl group, provided that $R_{21}$ and $R_{22}$ may be same or different and combine with each other to form a ring.

14 Claims, No Drawings

METHOD FOR DEVELOPING A SILVER HALIDE COLOR PHOTOGRAPHIC LIGHT-SENSITIVE MATERIAL FOR COLOR PROOF USING A SPECIFIED COLOR DEVELOPING AGENT

FIELD OF THE INVENTION

This invention relates to a silver halide color photographic light-sensitive material applicable for forming a color image for proofreading (color proof) out of black-and-white halftone dot images which are subjected to color separation in plate making & printing processes.

BACKGROUND OF THE INVENTION

In the field of a graphic art, a number of plate making films are used for photographing colors separately, composing images, and so forth, in the step of making a printing plate having thereon a halftone dot image formed out of a continuous tone image on a reversal film, color negative film, color paper, and the like. This makes processing so complicated that so many errors such as erroneous lettering, layouts and so forth cannot be avoided.

Furthermore, various corrections for lettering, layout, coloring and so forth are requested at random by clients, so that missing of the corrections is liable to take place. It is also necessary to make an advance check on whether a printed matter can be finished to meet the requirements of color tone and gradation.

For the purpose of making confirmation of this kind of proofreading, not only a proof-print system but also a variety of systems have been made public and available on the market. These systems include, for example, those using a CRT, those using non-silver light-sensitive materials comprising a photopolymer, diazo compound or the like, those forming an image with a dry toner, an electro-photographic system, and so forth. However, these proofreading systems have the problems such as a long time required to finish a proof sheet, an expensive material cost, a poor workability, and so forth, so that they can not be the systems satisfactory for practical use.

The other systems than the above for preparing a proof include a system in which a color-separated halftone original is printed on a color light-sensitive material through color-separated light. These systems include a method in which a proof is obtained on a color light-sensitive material through a photographing system by making use of a projection lens, disclosed in Japanese Patent Publication Open to Public Inspection (hereinafter referred to as Japanese Patent O.P.I. Publication) Nos. 60-4276/1985, 62-280746/1987, 62-280747/1987, 62-280748/1987, 62-280749/1987, 62-280750/1987 and 62-280849/1987, and so forth; or a contact exposure system under marketing by Chesley F. Carlson with a trade name of 'The Carlson Proofmaster System' and by Kreonite Inc. with a trade name of 'Color Proofing System', respectively.

Either system using a positive or negative type silver halide color photographic light-sensitive material enables to perform color proofreading at less cost in shorter time and comprises more excellent characteristics than the other systems.

In these systems, the color-separated B/W halftone dot images which are formed by subjecting a color original to color separation for converting to the halftone dot image are printed one after another on a sheet of color paper in a contact printing method, and the printed color paper is subjected to color developing to form the color images with the dyes produced imagewise from the couplers. The resulting color images are used for proofreading.

In addition to the foregoing systems, a silver dye bleaching system is known. However, this system is unsuitable for a proofreading image forming system where an ever stable and high quality image is required, because of a defect that processings are unstable.

In this regard, a proofreading image forming system where a color image is formed by coupling of a coupler and an aromatic primary amine type developer on a silver halide color photographic light-sensitive material has an advantage that a stable quality image can be prepared.

In such a process, it is required for a color paper that a hue of a dye image produced from a coupler is close to that of a printed color image. At present, however, no such technical requirements have ever been fully satisfied.

With respect to this technical problem, such method is disclosed in Japanese Patent Application O.P.I. 62-109055/1987 that a hue of a magenta image can be closer to that of a printed matter by exposing a magenta color-separated negative to blue light and additionally to green light. As described in the foregoing application, however, no any satisfactory approximation of a hue can be achieved by controlling an exposure on an ordinary color paper.

Japanese Patent Application O.P.I. 61-47957/1986 and 61-28948/1986 disclose that combined use of a pyrazoloazole type magenta coupler and alkyl phosphate can reduce a subsidiary absorption in a longer wavelength region, while it does not disclose an application for a color proof. Therefore, a hue of a color proof image of which density is expressed by that of a halftone dot can not be anticipated only from a hue of an ordinary photographic image and a spectral absorption.

Further, an approximation of a hue in some limited area (limited halftone area) does not necessarily result in completely satisfying the conditions required to a color proof, and therefore, a high approximation of a color image in all area from a highlight to a shadow is necessary for preparing a color proof having a hue of a further higher approximation.

SUMMARY OF THE INVENTION

It is an object of the invention to provide a silver halide color photographic light-sensitive material which is applicable for making a color proof and capable of providing a color image with an improved hue very close to that of a printed image, and especially to provide a silver halide color photographic light-sensitive material which makes it possible to obtain a color image of a hue approximate to that of a printed yellow image.

DETAILED DESCRIPTION OF THE INVENTION

The object of the invention can be achieved with a silver halide color photographic light-sensitive material (hereinafter referred to as a light-sensitive material) containing at least a magenta coupler represented by Formula M-I and forming at least a part of a dye composing a magenta image, wherein the light-sensitive material is characterized by that it developed by a developing solution containing a developing agent represented by Formula III in a ratio of not less than 55 mol% to the total developing agents, and that the magenta image comprises $\lambda_{LO.2}$ of a spectral absorption in a region of 580-630 nm.

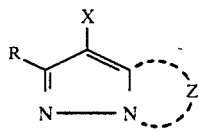

Formula M-I wherein Z represents a group of non-metal atoms necessary to form a nitrogen-containing heterocyclic ring including a substituted one; X represents a hydrogen atom or a group capable of splitting off upon a reaction with an oxidized product of a developing agent; and R represents a hydrogen atom or a substituent;

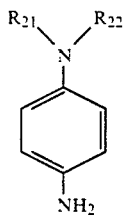

Formula III wherein $R_{21}$ and $R_{22}$ represent independently an alkyl group, provided that $R_{21}$ and $R_{22}$ may be same or different and combine with each other to form a ring.

The light-sensitive materials preferably applicable to the invention include those capable of forming a positive image out of a positive B/W halftone dot image; those using a direct positive silver halide emulsion; those of a reversal type; and those subject to a silver dye bleach process. Among them, it is particularly preferable to use a light-sensitive material containing a direct positive silver halide emulsion.

In the invention, λmax of a magenta image preferably ranges at 530 nm to 560 nm in a spectral absorption.

$\lambda_{LO.2}$ and λmax in a spectral absorption of a magenta image are measured in the following method.

In the case of a positive type light-sensitive material, it is exposed uniformly to a minimum quantity of red-light to obtain a minimum density of a cyan image, and to a minimum quantity of blue-light to obtain a minimum density of a yellow image. Then, it is exposed to white light through an ND filter and developed to form a magenta image, wherein a density of the ND filter is adjusted so that a maximum absorbance of the magenta image in a spectral absorption of 500-700 nm becomes 1.0 when measuring with a spectrophotometer equipped with an integrating sphere and adjusted to zero with a standard MgO board.

In the case of a negative type light-sensitive material, it is exposed to green light through the ND filter and developed to form a magenta image, wherein a density of the ND filter is adjusted likewise so that a maximum absorbance of the magenta image becomes 1.0.

$\lambda_{LO.2}$ is defined by a wavelength corresponding to an absorbance of 0.2 in a longer wavelength region on a spectral absorption curve of the magenta image, provided that the maximum absorbance is 1.0.

In the invention, this $\lambda_{LO.2}$ is in a wavelength region of 585 to 630 nm, preferably 600 to 630 nm, more preferably 600 to 620 nm, and further more preferably 600 to 610 nm. The magenta coupler preferably applicable to a green-sensitive layer of the invention is represented by the following Formula M-I.

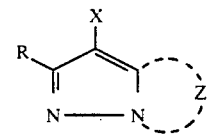

Formula M-I wherein Z represents a group of non-metal atoms necessary to form a nitrogen-containing heterocyclic ring including those having a substituent; X represents a hydrogen atom or a group capable of being split off upon reaction with an oxidized product of a color developing agent; and R represents a hydrogen atom or a substituent.

There is no special limitation to the substituents represented by R. The typical examples include the groups of alkyl, aryl, anilino, acylamino, sulfonamide, alkylthio, arylthio, alkenyl, cycloalkyl and so forth. Besides the above, they also include a halogen atom and the groups of cycloalkenyl, alkinyl, heterocyclic, sulfonyl, sulfinyl, phosphonyl, acyl, carbamoyl, sulfamoyl, cyano, alkoxy, aryloxy, heterocyclicoxy, siloxy, acyloxy, carbamoyloxy, amino, alkylamino, imido, ureido, sulfamoylamino, alkoxycarbonylamino, aryloxycarbonylamino, alkoxycarbonyl, aryloxycarbonyl, heterocyclicthio, a spiro compound residue, a cross-linked hydrocarbon compound residue, and so forth.

The alkyl group represented by R preferably has 1 to 32 carbon atoms and may be linear or branched.

The aryl group represented by R is preferably a phenyl group.

The acylamino group represented by R includes the groups of alkylcarbonylamino, arylcarbonylamino, and so forth.

The sulfonamide group represented by R includes the groups of alkylsulfonylamino, arylsulfonylamino, and so forth.

In the alkylthio and arylthio groups represented by R, the alkyl and aryl components thereof include the alkyl and aryl groups represented by R.

The alkenyl group preferably has 2 to 32 carbon atoms and may be linear or branched.

The cycloalkyl group preferably has 3 to 12 carbon atoms, and more preferably 5 to 7 carbon atoms.

The cycloalkenyl group preferably has 3 to 12 carbon atoms, and more preferably 5 to 7 carbon atoms.

The sulfonyl group includes the groups of alkylsulfonyl, arylsulfonyl, and so forth.

The sulfinyl group includes the groups of alkylsulfinyl, arylsulfinyl, and so forth.

The phosphonyl group includes the groups of alkylphosphonyl, alkoxyphosphonyl, aryloxyphosphonyl, arylphosphonyl, and so forth.

The acyl group includes the groups of alkylcarbonyl, arylcarbonyl, and so forth.

The carbamoyl group includes the groups of alkylcarbamoyl, arylcarbamoyl, and so forth.

The sulfamoyl group includes the groups of alkylsulfamoyl, arylsulfamoyl, and so forth.

The acyloxy group includes the groups of alkylcarbonyloxy, arylcarbonyloxy, and so forth.

The carbamoyloxy group includes the groups of alkylcarbamoyloxy, arylcarbamoyloxy, and so forth.

The ureido group includes the groups of alkylureido, arylureido, and so forth.

The sulfamoylamino group includes the groups of alkylsulfamoylamino, arylsulfamoylamino, and so forth.

The heterocyclic group is preferably a 5 to 7 membered ring such as the groups of 2-furyl, 2-thienyl, 2-pyrimidinyl, 2-benzithiazolyl, and so forth.

The heterocyclicoxy group is preferably a 5 to 7 membered ring such as the groups of 3,4,5,6-tetrahydropyranyl-2-oxy, 1-phenyltetrazole-5-oxy, and so forth.

The heterocyclicthio group is preferably a 5 to 7 membered ring such as the groups of 2-pyridylthio, 2-benzothiazolylthio, 2, 4-diphenoxy-1, 3, 5-triazole-6-thio, and so forth.

The siloxy group includes the groups of trimethylsiloxy, triethylsiloxy, dimethylbutylsiloxy, and so forth.

The imido group includes the groups of succinimido, 3-heptadecylsuccinimido, phthalimido, glutarimido, and so forth.

The spiro compound residue includes a spiro [3.3] heptane-1-yl group, and so forth.

The cross-linked hydrocarbon compound residue includes the groups of bicyclo [2.2.1] heptane-1-yl, tricyclo [3.3.1.1$^{3,7}$] decane-1-yl, 7,7-dimethyl-bicyclo [2.2.1] heptane-1-yl, and so forth.

The group represented by X, which is capable of being split off upon reaction with an oxidized product of a color developing agent, includes a halogen atom such as chlorine, bromine, fluorine and so forth; the groups of alkoxy, aryloxy, heterocyclicoxy, acyloxy, sulfonyloxy, alkoxycarbonyloxy, aryloxycarbonyl, alkyloxalyloxy, alkoxyoxalyloxy, alkylthio, arylthio, heterocyclicthio, alkyloxythiocarbonylthio, acylamino, and sulfonamide, a nitrogen-containing heterocyclic ring having a linkage on an N atom, the groups of alkyloxycarbonylamino, aryloxycarbonylamino, carboxyl,

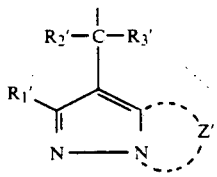

wherein $R_1'$ is synonymous with the above-given R; $Z'$ is synonymous with the above-given Z; and $R_2'$ and $R_3'$ represent each a hydrogen atom, an aryl, alkyl or heterocyclic group; and so forth. Among them, a halogen atom is preferable and a chlorine atom is more preferable.

The nitrogen-containing heterocyclic ring formed by Z or Z' includes the rings of pyrazole, imidazole, triazole, tetrazole, and so forth. The substituents thereof are the same as those defined in R.

Those represented by Formula M-I are represented more concretely by the following Formulas M-II through M-VII;

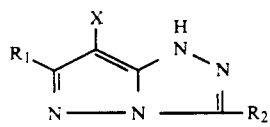
Formula M-II

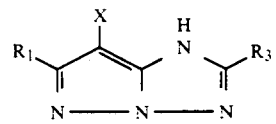
Formula M-III

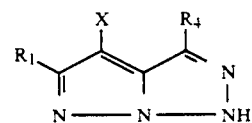
Formula M-IV

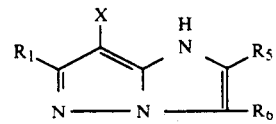
Formula M-V

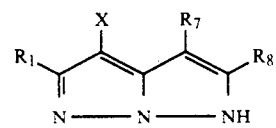
Formula M-VI

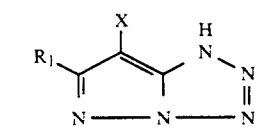
Formula M-VII

In the above Formulas M-II through M-VII, $R_1$ through $R_8$ and X are each synonymous with the aforegiven R and X.

Among those represented by Formula M-I, preferable one is represented by the following Formula M-VIII:

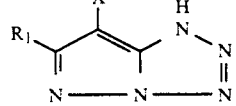
Formula M-VIII wherein $R_1$, X and $Z_1$ are each synonymous with R, X and Z in Formula M-I.

Among the magenta couplers represented by Formulas M-II through M-VII; the particularly preferable magenta coupler is represented by Formula M-II.

When applying it to form a positive image, R in Formula M-I or $R_1$ in Formulas M-II through M-VIII satisfies preferably the following Requirement 1, more preferably Requirements 1 and 2, and further more preferably Requirements 1, 2 and 3;

Requirement 1 : a terminal atom directly bonded to a heterocyclic ring is a carbon atom;

Requirement 2 : no or only one hydrogen atom is bonded to the terminal carbon atom;

Requirement 3 : every bond between the terminal carbon atom and the atoms adjacent thereto is a single bond.

The most preferable substituents R and $R_1$ satisfying the above given requirements are represented by the following Formula M-IX :

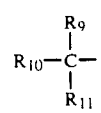
Formula M-IX wherein $R_9$, $R_{10}$ and $R_{11}$ are each synonymous with the aforementioned R, provided that two or more of $R_9$, $R_{10}$ and $R_{11}$ are not the hydrogen atoms at once.

Two of the above-given $R_9$, $R_{10}$ and $R_{11}$ may combine together to form a saturated or unsaturated ring such as a cycloalkane, cycloalkene or heterocyclic ring, and further, the rest may combine with the ring to constitute a cross-linked hydrocarbon compound residue.

In Formula M-IX it is preferable that: (i) at least two of $R_9$ through $R_{11}$ are the alkyl groups, or (ii) one of $R_9$ through $R_{11}$ is a hydrogen atom, and the rest combine to form a cycloalkyl group together with a terminal carbon atom.

In case (i), it is more preferable that two of $R_9$ through $R_{11}$ are the alkyl groups and the rest is either a hydrogen atom or an alkyl group.

Those represented by the following Formula M-X are preferable for the substituents combined to the rings formed by Z in Formula M-I and $Z_1$ in Formula M-VIII, and for the substituents represented by $R_2$ through $R_8$ in Formulas M-II through M-VI, Formula M-X $$-R^1-SO_2-R^2$$

wherein $R_1$ represents an alkylene group, and $R^2$ represents an alkyl, cycloalkyl or aryl group.

The alkylene group represented by $R^1$ has preferably 2 or more carbon atoms in a straight chain portion thereof, and more preferably 3 to 6 carbon atoms. This alkylene group may be linear or branched.

The cycloalkyl group represented by $R^2$ is preferably a 5 or 6 membered ring.

When applying the magenta coupler to form a negative image, R in Formula M-I or $R_1$ in Formulas M-II through M-VIII satisfies preferably the following Requirement 1, and more preferably Requirements 1 and 2;

Requirement 1 : a terminal atom directly bonded to a heterocyclic ring is a carbon atom;

Requirement 2 : at least two hydrogen atoms are bonded to the terminal carbon atom.

The most preferable substituents R and $R_1$ satisfying the above given requirements are represented by the following Formula M-XI:

Formula M-XI $$R_{12}-CH_2-$$

wherein $R_{12}$ is synonymous with the aforementioned R. $R_{12}$ is preferably a hydrogen atom or an alkyl group.

The typical examples of the magenta coupler relating to the invention are shown as follows.

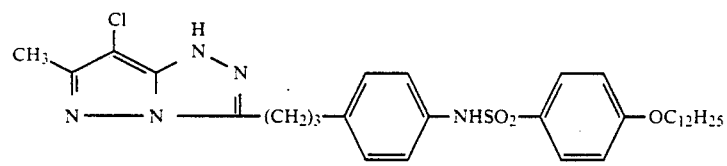

M-1

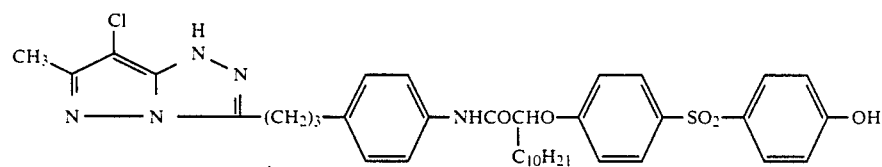

M-2

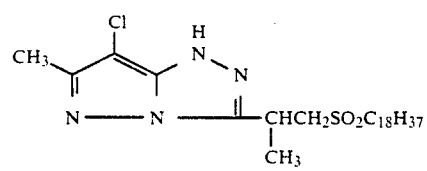

M-3

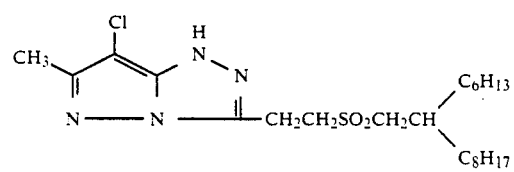

M-4

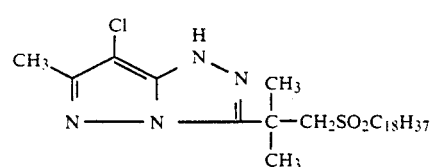

M-5

-continued
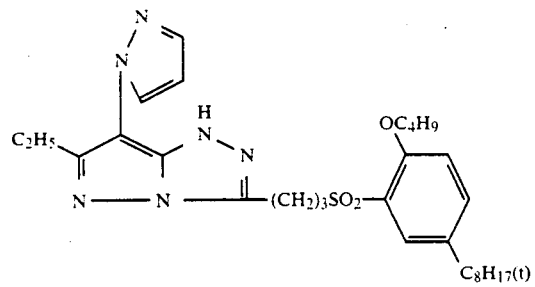
M-6
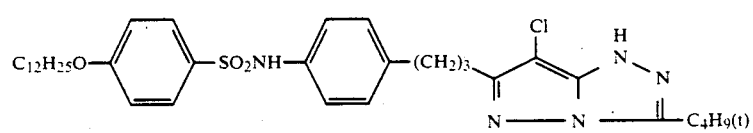
M-7
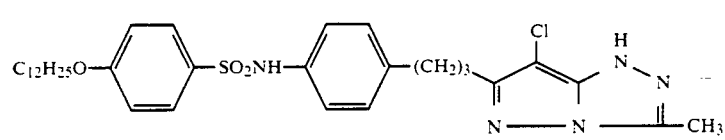
M-8
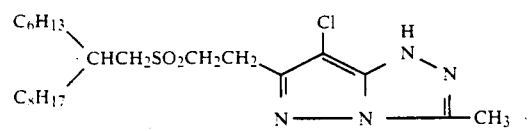
M-9
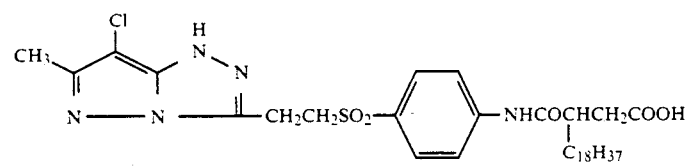
M-10
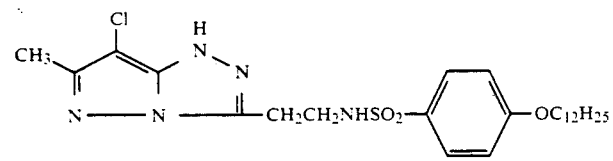
M-11
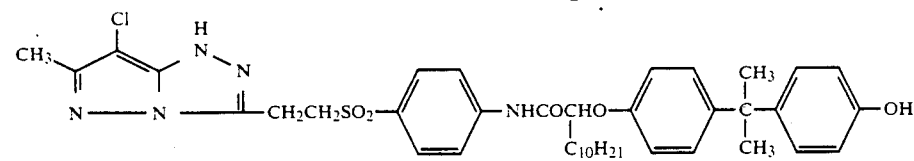
M-12
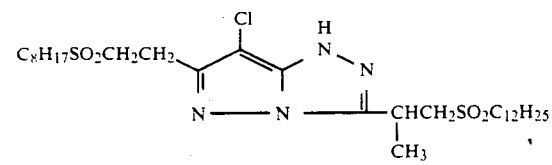
M-13
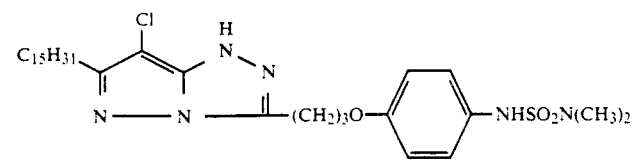
M-14

M-15
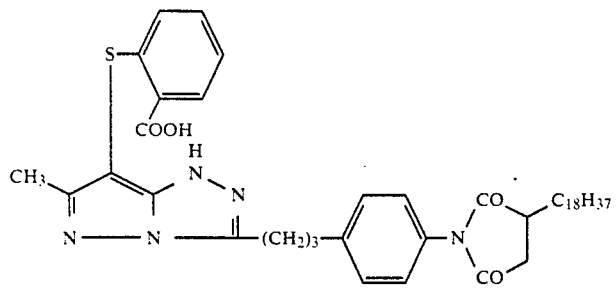
M-16
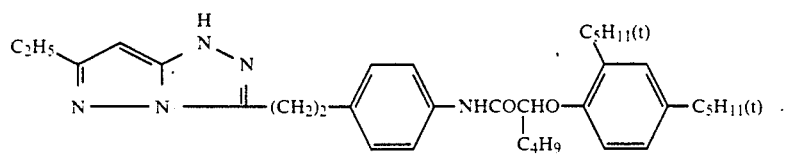
M-17
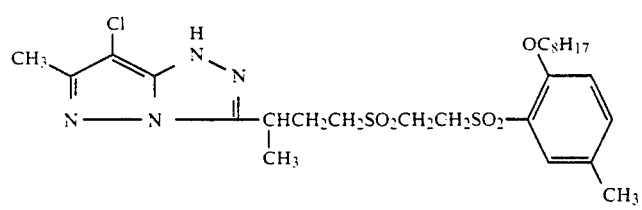
M-18
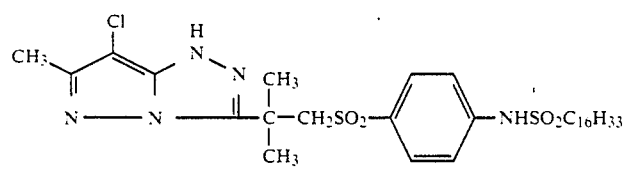
M-19
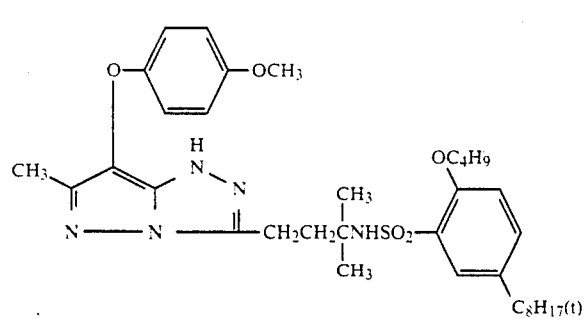
M-20
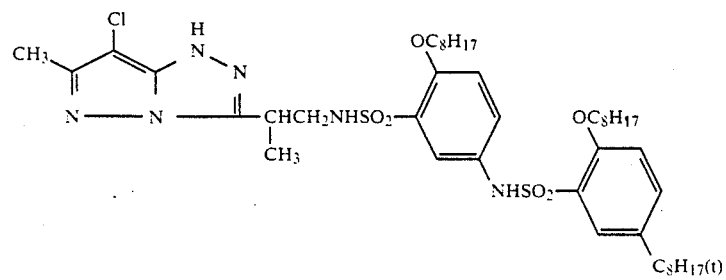
M-21
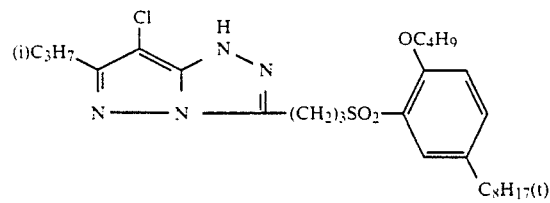

-continued
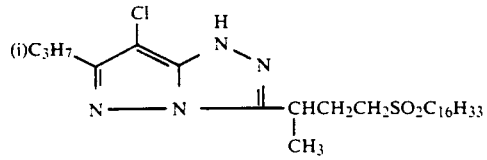
M-22
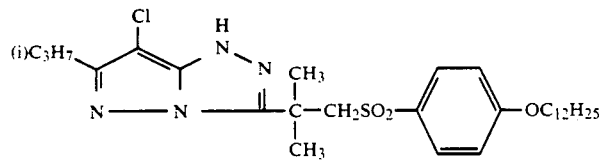
M-23
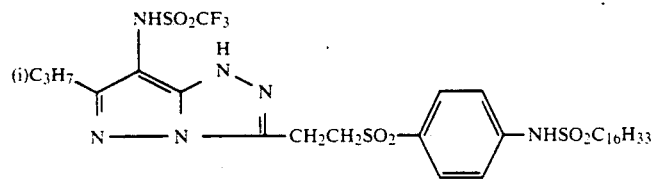
M-24
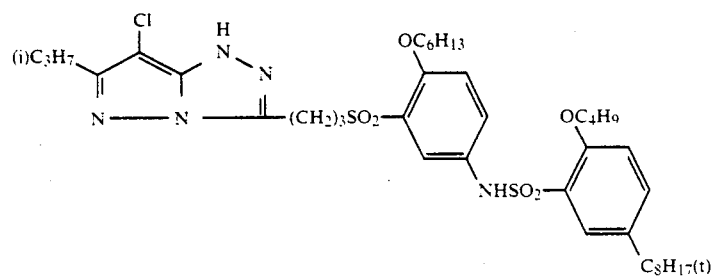
M-25
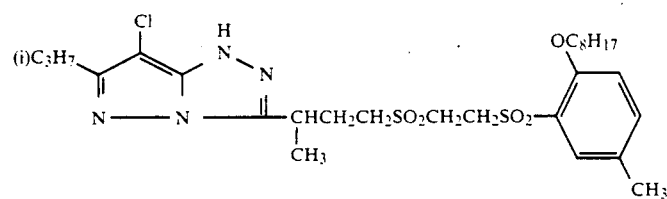
M-26
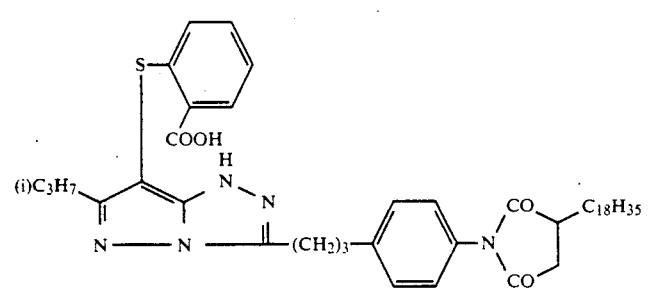
M-27
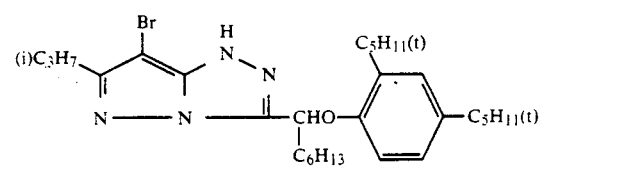
M-28
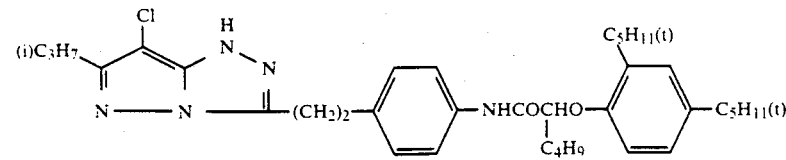
M-29

-continued
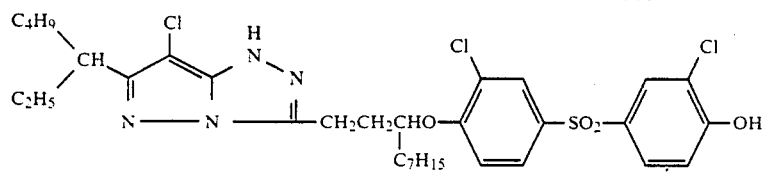
M-30
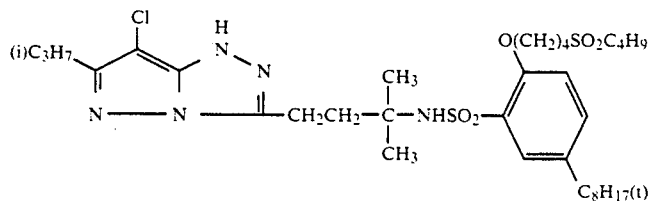
M-31
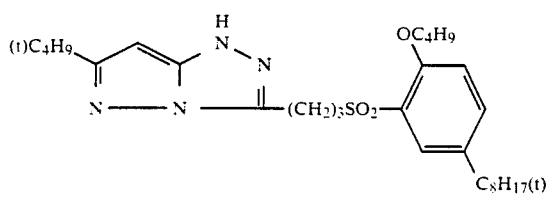
M-32
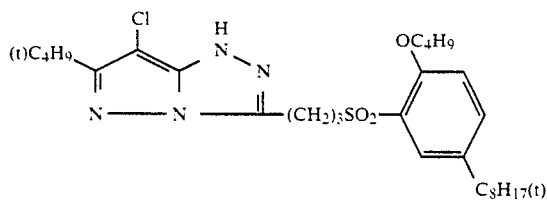
M-33
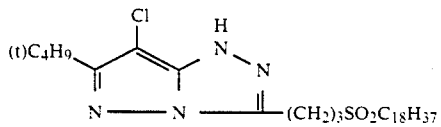
M-34
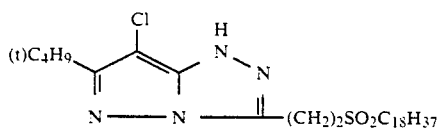
M-35
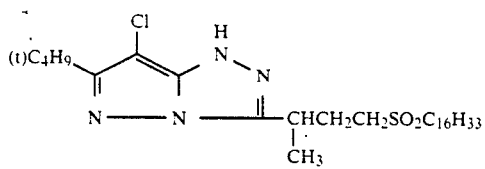
M-36
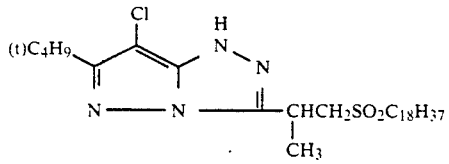
M-37
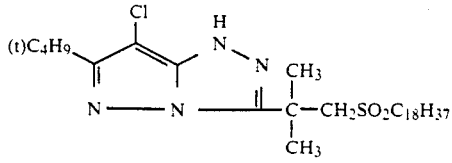
M-38

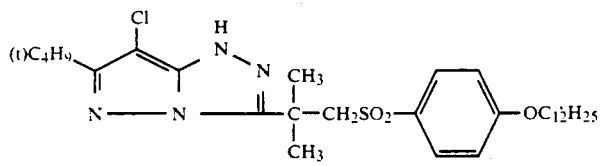
M-39
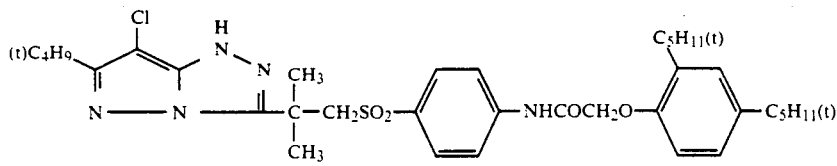
M-40
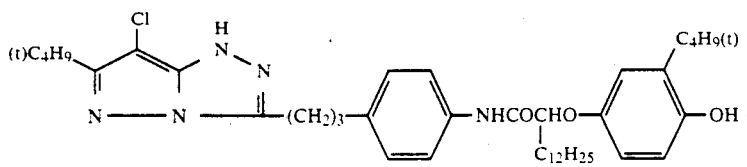
M-41
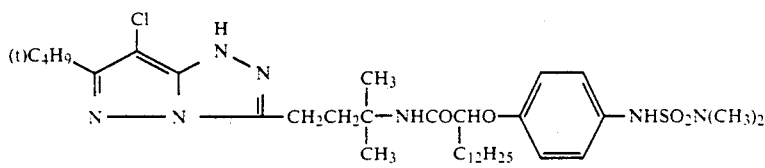
M-42
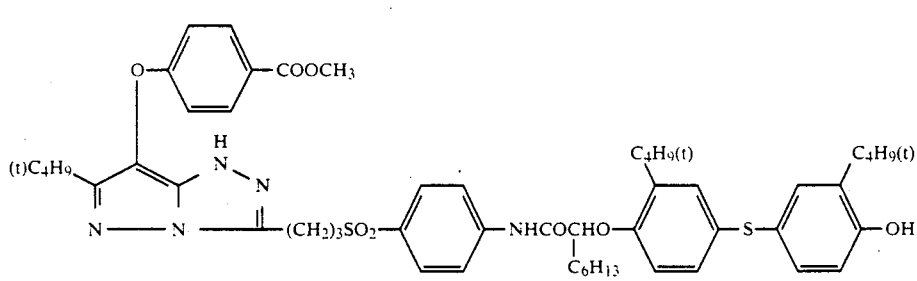
M-43
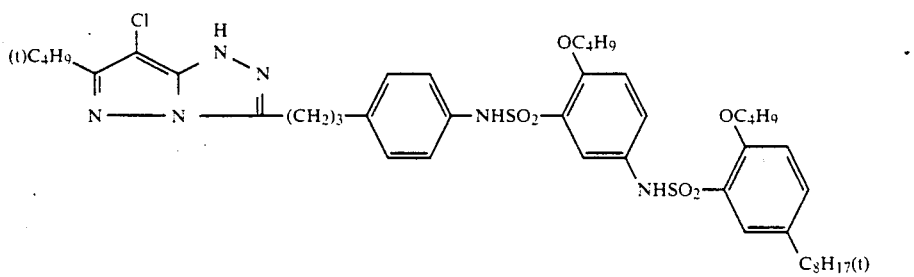
M-44
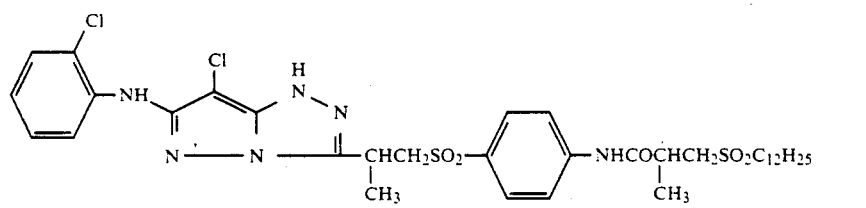
M-45
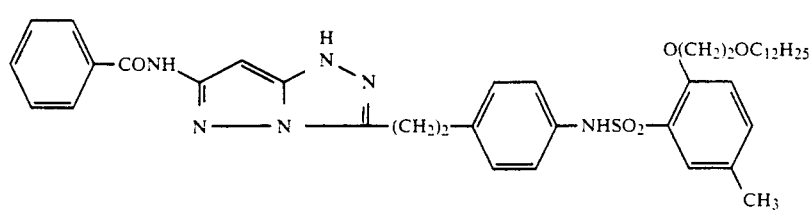
M-46

-continued
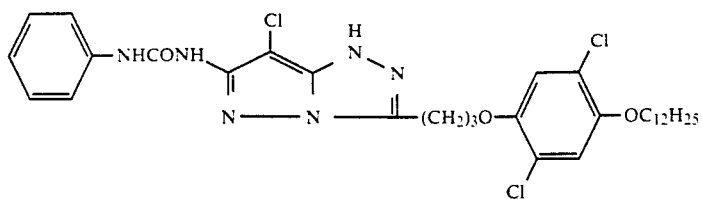
M-47
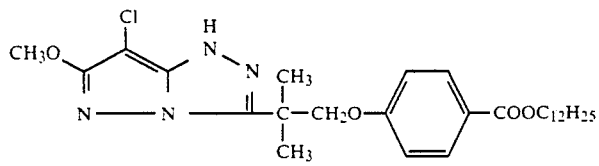
M-48
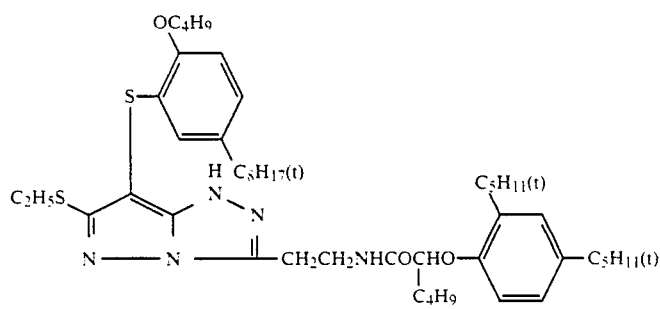
M-49
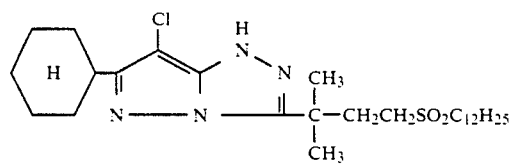
M-50
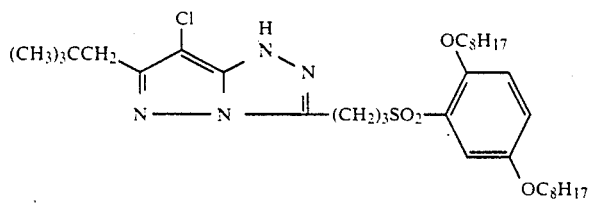
M-51
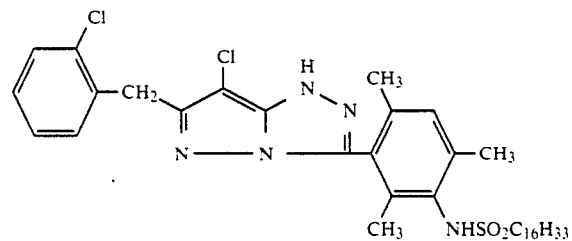
M-52
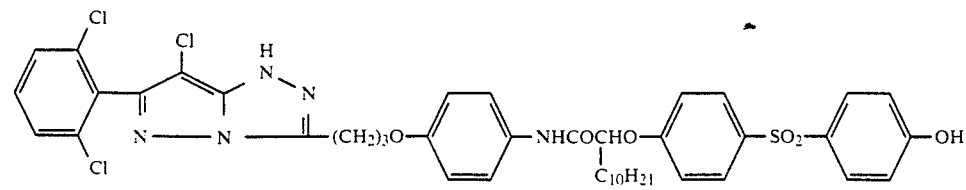
M-53

-continued
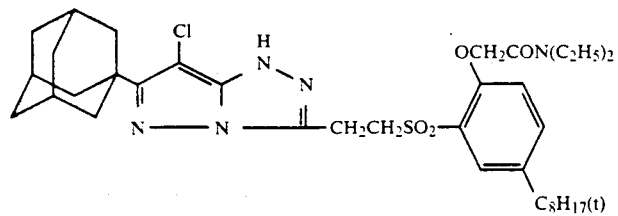
M-54
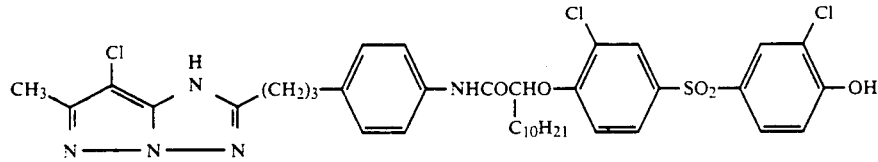
M-55
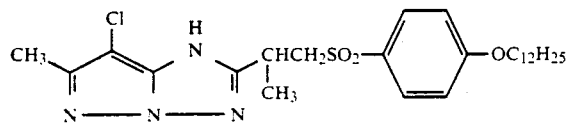
M-56
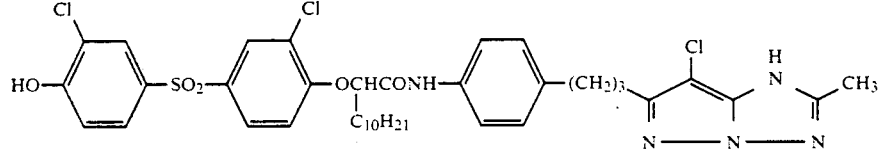
M-57
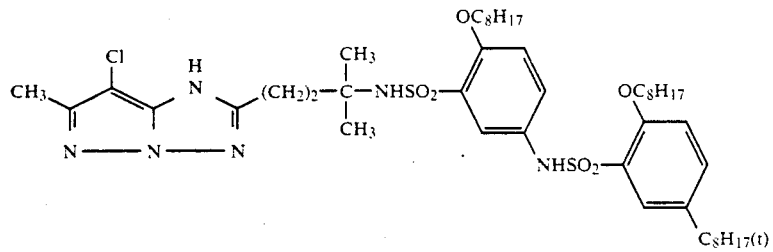
M-58
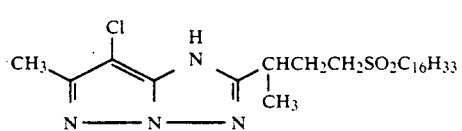
M-59
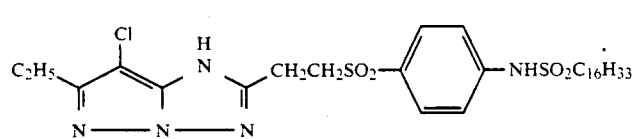
M-60
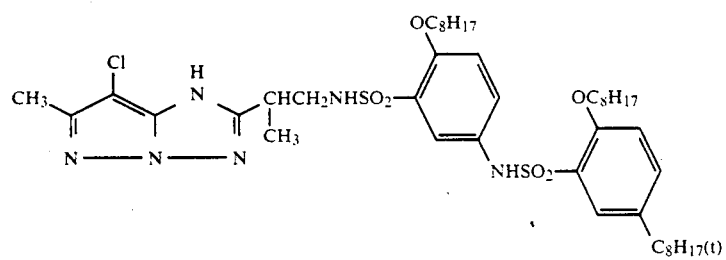
M-61
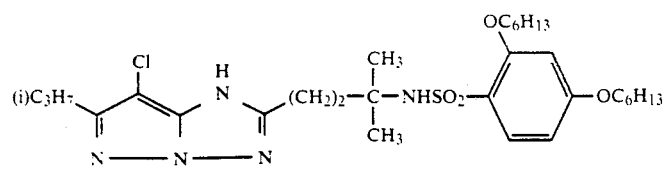
M-62

-continued
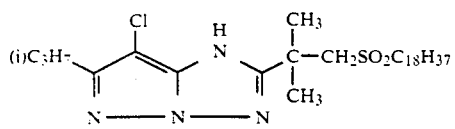
M-63
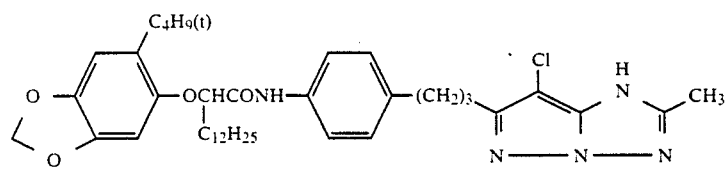
M-64
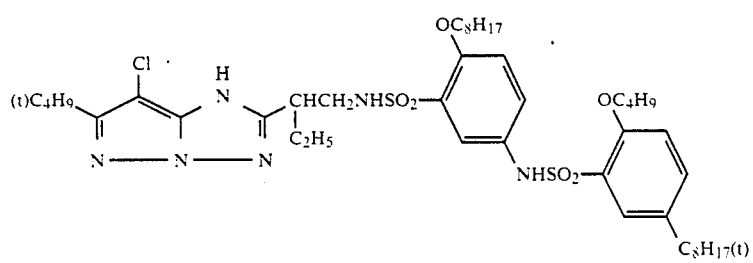
M-65
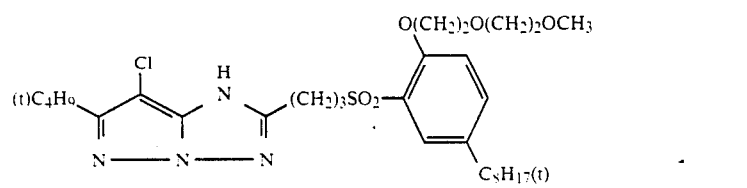
M-66
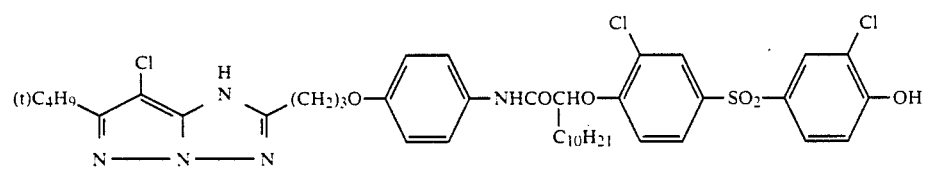
M-67
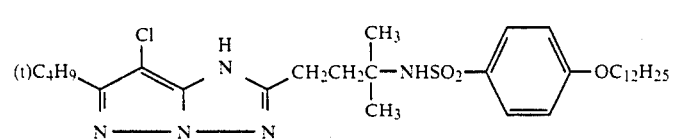
M-68
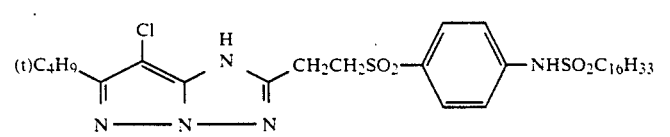
M-69
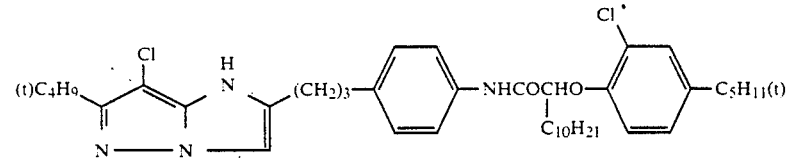
M-70
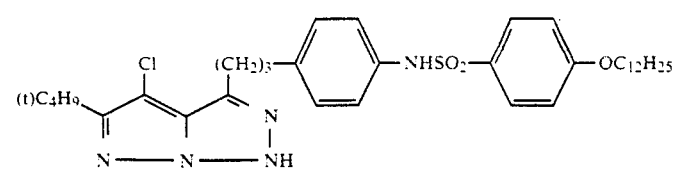
M-71

M-72
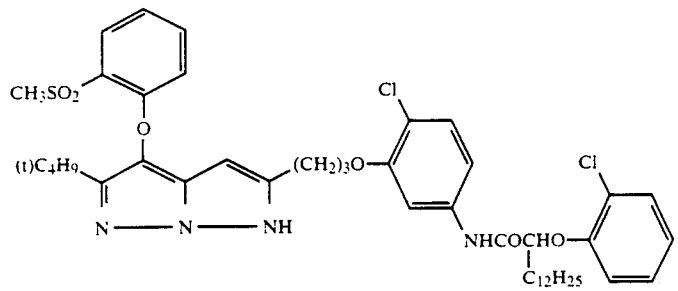
M-73
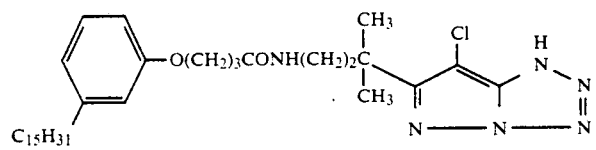
M-74
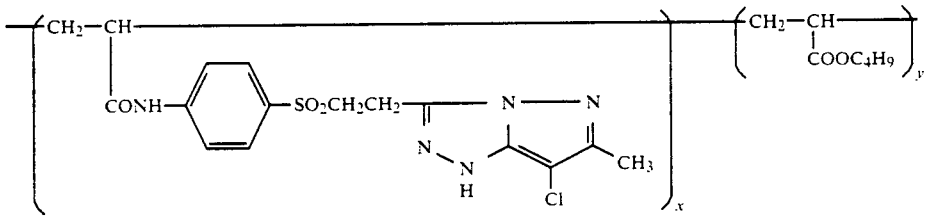
x:y = 50:50
M-75
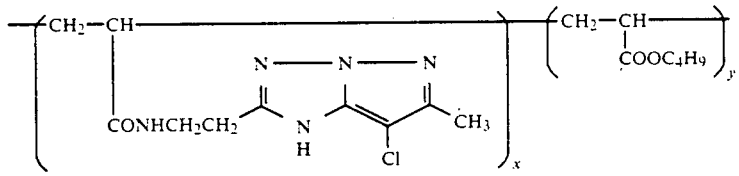
x:y = 50:50
M-76
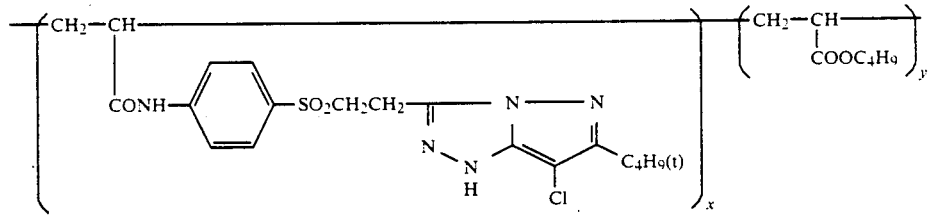
x:y = 50:50
M-77
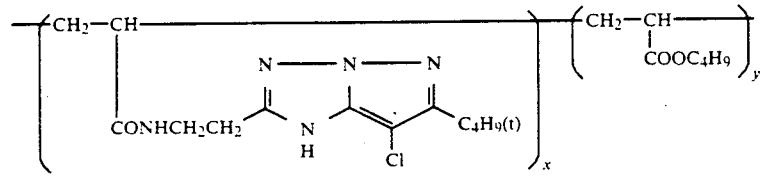
x:y = 50:50
Besides the above-given examples, they also include the compounds given in Japanese Patent Application No. 61-9791/1986, pp.66-122, particularly the compounds Nos. 1 to 4, 6, 8 to 17, 19 to 24, 26 to 43, 45 to 59, 61 to 104, 106 to 121, 123 to 162, and 164 to 223.
The above-mentioned couplers can be synthesized with references to Journal of the Chemical Society, Perkin I, 1977, pp.2047-2052; U.S. Pat. No. 3,725,067; Japanese Patent O.P.I. Publication Nos. 59-99437/1984, 58-42045/-1983, 59-162548/1984, 59-171956/1984, 60-33552/1985, 60-43659/1985, 60-172982/1985, and 60-190779/1985; and so forth.

The above-mentioned couplers are used usually in an amount of $1 \times 10^{-3}$ mole to 1 mol per mol of silver halide, and preferably $1 \times 10^{-2}$ mole to $8 \times 10^{-1}$ mole.

The couplers may also be used with the other kinds of magenta couplers in combination.

The yellow couplers preferably used for the invention are represented by the following Formula Y-I:

Formula Y-I

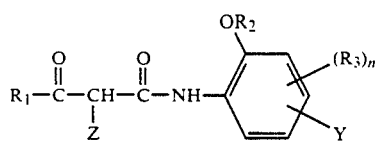

wherein $R_1$ represents an alkyl group or a cycloalkyl group; $R_2$ represents an alkyl group, a cycloalkyl group, an acyl group or an aryl group; $R_3$ represents a group substitutable to a benzene ring; n is an integer of 0 or 1; Y represents a monovalent ballast group; and Z represents a hydrogen atom or a group capable of being split off upon a coupling reaction.

In Formula Y-I, the alkyl group represented by $R_1$ may be either linear or branched and includes a methyl group, an ethyl group, an isopropyl group, a t-butyl group, a dodecyl group and so forth. The alkyl group may have a substituent such as a halogen atom and the groups of aryl, alkoxy, aryloxy, alkylsulfonyl, acylamino, alkoxy, hydroxy and so forth.

The cycloalkyl group represented by $R_1$ includes the groups of cyclopropyl, cyclohexyl, adamantyl and so forth.

$R_1$ is preferably the branched alkyl groups.

The alkyl and cycloalkyl groups represented by $R_2$ are the same group as those represented by $R_1$.

The aryl groups includes a phenyl group. The alkyl, cycloalkyl and aryl groups represented by $R_2$ may each have the same substituents as those for $R_1$. The acyl group includes the groups of acetyl, propionyl, butyryl, hexanoyl benzoyl and so forth.

The group represented by $R_2$ is preferably an alkyl or aryl group and more preferably an alkyl group.

There is no special limitation to $R_3$, provided it is substitutable to a benzene ring; it includes a halogen atom, an alkyl group such as the groups of ethyl, i-propyl and t-butyl, an alkoxy group such as a methoxy group, an aryloxy group such as a phenyloxy group, an acyloxy group such as the groups of methyl-carbonyloxy and benzoyloxy, an acylamino group such as the groups of acetamide and phenylcarbonylamino, a carbamoyl group such as the groups of N-methylcarbamoyl and N-phenylcarbamoyl, an alkylsulfonamide group such as an ethylsulfonylamino, an arylsulfonamide group such as a phenylsulfonylamino group, a sulfamoyl group such as the groups of N-propylsulfamoyl and N-phenylsulfamoyl, an imido group such as the groups of succinimido and glutarimido, and so forth.

In Formula Y-I, Z represents a group which can be split off upon a coupling reaction with an oxidized product of a developing agent, and is represented by Formula Y-II or Y-III:

Formula Y-II $-OR_{10}$ wherein $R_{10}$ represents an aryl or heterocyclic group each including those having a substituent;

Formula Y-III

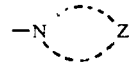

wherein X represents a non-metal atom group necessary for forming a 5- or 6-membered ring together with a nitrogen atom. The atomic group necessary for composing a non-metal atom group includes methylene, methine, substituted methine,

—NH—, —N=, —O—, —S—, —SO$_2$—, and so forth.

A ballast group represented by Y is a group for providing a colored dye with anti-diffusibility, such as an organic group having 8 to 30 carbons. The preferable examples are an aliphatic group and an aromatic group including an acyl group, a carbamoyl group, a sulfamoyl group, a sulfonamide group, an alkoxycarbonyl group, and so forth. Y is more preferably a group represented by —J—$R_{11}$, wherein $R_{11}$ represents an organic group containing one linkage group having a cabonyl or sulfonyl unit; the group having a carbonyl unit includes an ester group, an amido group, a carbamoyl group, an ureido group, a urethane group, and so forth; the group having a sulfonyl unit includes a sulfone group, a sulfonamido group, a sulfamoyl group, an aminosulfonamido group, and so forth; J represents an acyl group, a carbamoyl group, a sulfamoyl group, a sulfonamido group, an alkoxycarbonyl group,

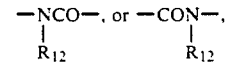

wherein $R_{12}$ represents a hydrogen atom, an alkyl group, an aryl group, or a heterocyclic group.

Next, the yellow couplers represented by Formula Y-I are exemplified below.

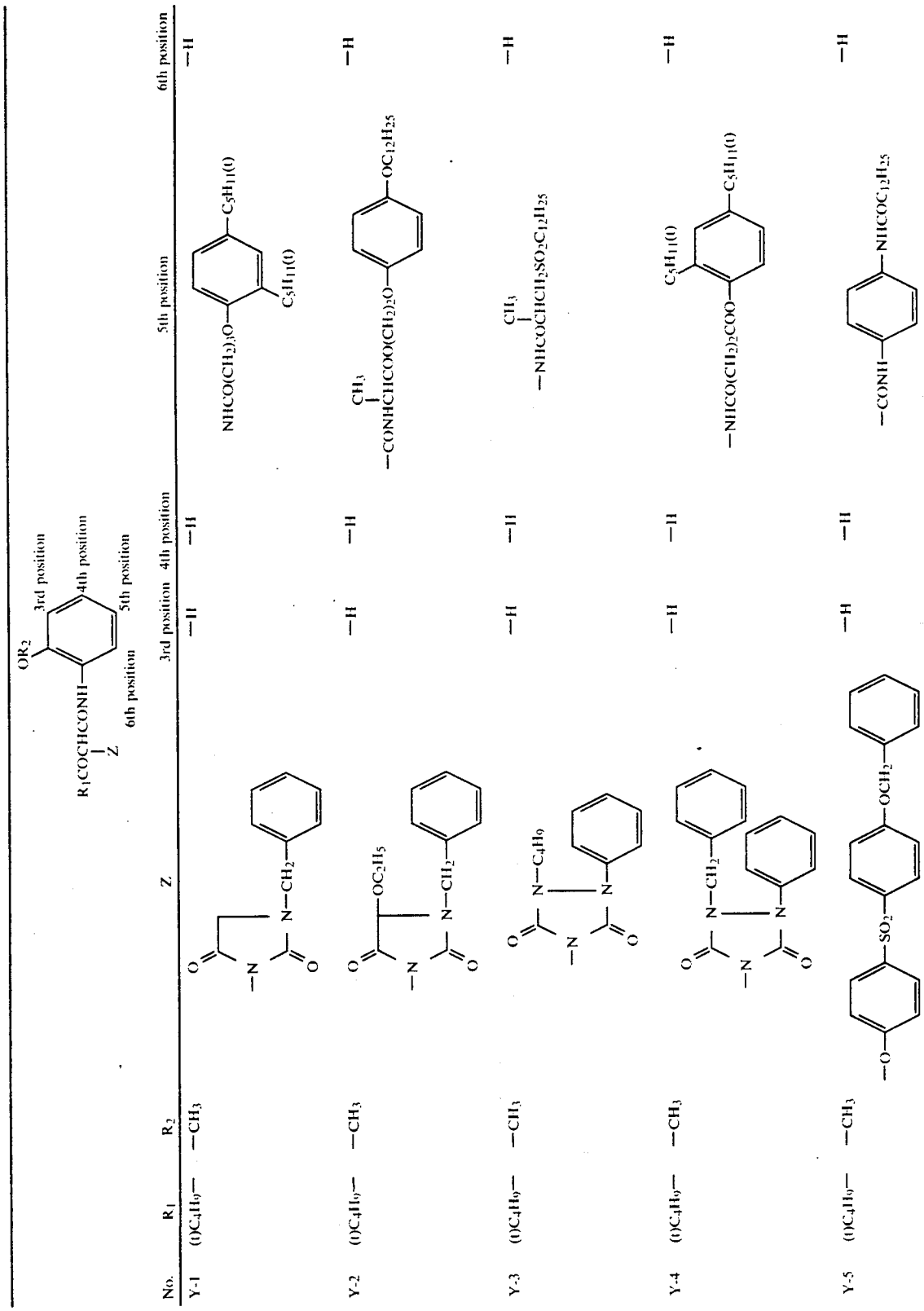

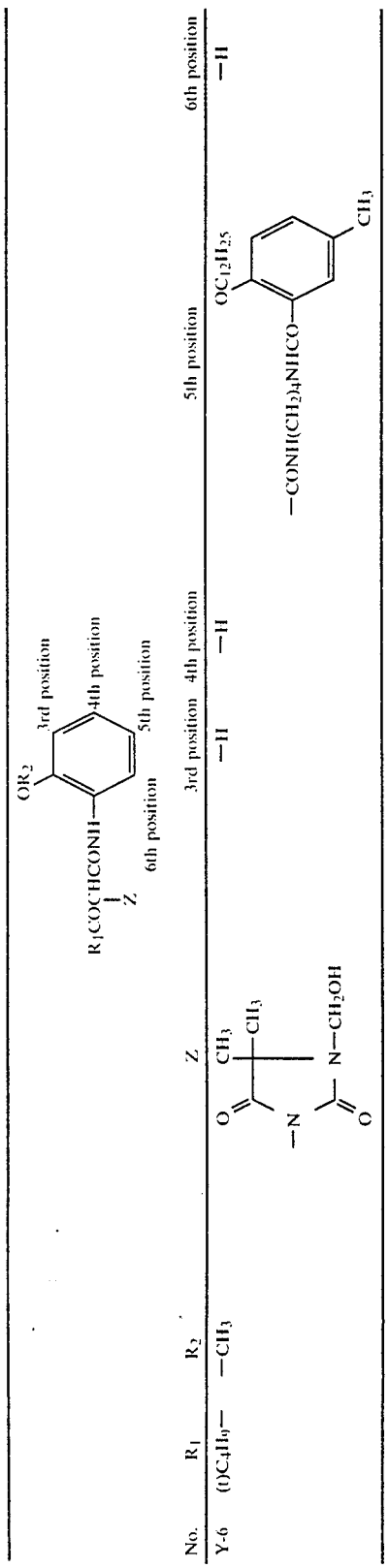
| No. | $R_1$ | $R_2$ | Z | 3rd position | 4th position | 5th position | 6th position |
|---|---|---|---|---|---|---|---|
| Y-6 | $(OC_4H_9)-$ | $-CH_3$ | (see structure) | $-H$ | $-H$ | $-CONH(CH_2)_4NHCO-$ (aryl group with $OC_{12}H_{25}$ and $CH_3$) | $-H$ |

The cyan couplers added to the cyan image forming layers in the invention include a phenol or naphthol type cyan dye-forming coupler.

Among these, the couplers represented by the following Formula C-I and/or C-II are preferably used:

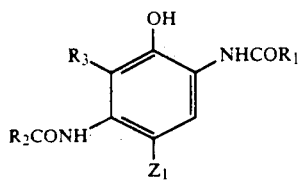

Formula C-I wherein $R_1$ represents an aryl group, a cycloalkyl group or a heterocyclic group; $R_2$ represents an alkyl group or a phenyl group; $R_3$ represents a hydrogen atom, a halogen atom, an alkyl group, or an alkoxy group; and $Z_1$ represents a hydrogen atom or a group which can be split off upon a reaction with an oxidized product of an aromatic primary amine type color developing agent;

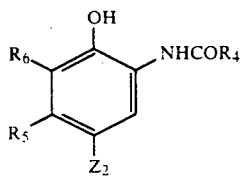

Formula C-II wherein $R_4$ and $R_5$ represent independently an alkyl group; $R_6$ represents a hydrogen atom, a halogen atom or an alkyl group; and $Z_2$ represents a hydrogen atom, or a group which can be split off upon a reaction with an oxidized product of an aromatic primary amine type color developing agent.

The above-given cyan couplers are described in U.S. Pat. Nos. 2,306,410, 2,356.475, 2,362,596, 2,367,531, 2,369,929, 2,423,730, 2,474,293, 2,476,008, 2,498,466, 2,545,687, 2,728,660, 2,772,162, 2,895,826, 2,976,146, 3,002,836, 3,419,390, 3,446,622, 3,476,563, 3,737,316, 3,758,308 and 3,839,044; Britisb Patent Nos. 478,991, 945,542, 1,084,480, 1,377,233, 1,388,024 and 1,543,040; Japanese Patent O.P.I. Publication Nos. 47-37425/1972, 50-10135/1975, 50-25228/1975, 50-112038/1975, 50-117422/1975, 50-130441/1975, 51-6551/1976, 51-37647/1976, 51-52828/1976, 51-108841/1976, 53-109630/1978, 54-48237/1979, 54-66129/1979, 54-131931/1979, 55-32071/1980, 59-146050/1984, 59-31953/1984 and 60-117249/1085; and so forth.

Usually, the couplers applicable to the respective silver halide emulsion layers of the invention are used in an amount of $1 \times 10^{-3}$ to 1 mol per mol of silver halide, and more preferably from $1 \times 10^{-2}$ to $8 \times 10^{-1}$ mol.

The couplers are added to the hydrophilic colloidal layers in such a manner that; the couplers are dissolved in a high boiling organic solvent having a boiling point of not lower than 150° C. in combination, if required, with a low boiling and/or water soluble organic solvent; the solution is dispersively emulsified with a surfactant in a hydrophilic binder such as an aqueous gelatin solution; and the emulsion is added to the hydrophilic colloidal layers. It is allowed to remove the low boiling organic solvent after or at the same time as dispersion.

In the invention, any high boiling organic solvents may be used in combination with a coupler. However, the organic solvents represented by the following Formula I or II are preferably used for the magenta couplers represented by Formula M-I and the yellow couplers represented by Formula Y-I;

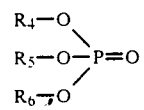

Formula I wherein $R_4$, $R_5$ and $R_6$ represent each an alkyl or aryl group, and at least two of them represent each an alkyl group having not more than 16 carbon atoms.

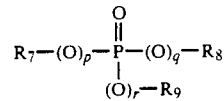

Formula II wherein $R_7$, $R_8$ and $R_9$ represent each an aliphatic group or an aromatic group; and p, q and r are each an integer of 0 or 1, provided that p, q and r are not 1 at once.

The organic solvents represented by Formula I are exemplified below.

I-1 dibutyl-(2-ethylhexyl) phosphate,
I-2 tri-(2-ethylhexyl) phosphate,
I-3 trihexyl phosphate,
I-4 tributyl phosphate,
I-5 trioctyl phosphate,
I-6 di-(2-ethylhexyl)butyl phosphate,
I-7 tridodecyl phosphate,
I-8 tridecyl phosphate,
I-9 tri-(2-methylhexyl) phosphate,
I-10 diethyl-hexadecyl phosphate,
I-11 triamyl phosphate,
I-12 dihexyl-(o-cresyl) phosphate,
I-13 diethyl-(2,4-di-t-butylphenyl) phosphate,
I-14 triethoxybutyl phosphate,
I-15 tributhoxyethyl phosphate,
I-16 dihexyl-phenyl phosphate,
I-17 dihexyl-(4-t-butylphenyl) phosphate, and
I-18 dihexyl-(4-nonylphenyl) phosphate Next, the typical examples of the organic solvents represented by Formula -II are shown below.

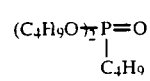

II-1

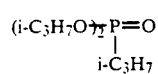

II-2

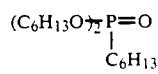

II-3

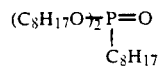

II-4

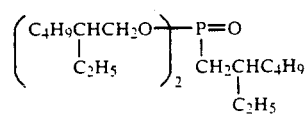

II-5

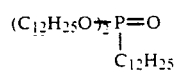

II-6

-continued
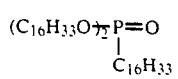 II-7
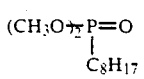 II-8
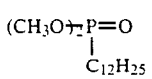 II-9
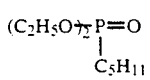 II-10
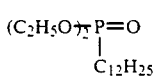 II-11
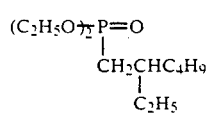 II-12
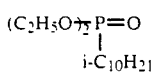 II-13
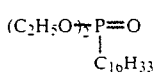 II-14
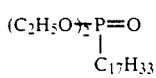 II-15
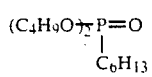 II-16
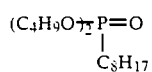 II-17
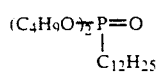 II-18
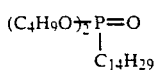 II-19
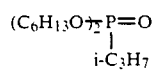 II-20
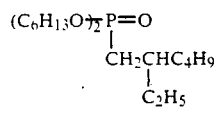 II-21
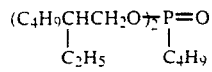 II-22
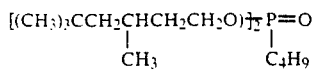 II-23
-continued
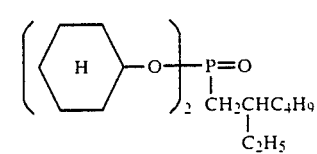 II-24
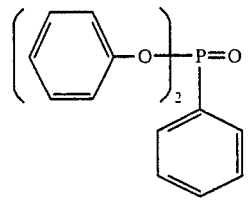 II-25
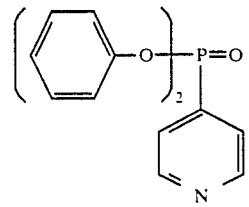 II-26
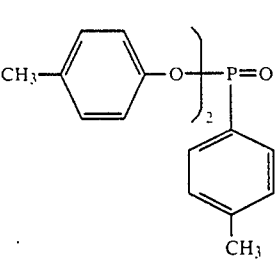 II-27
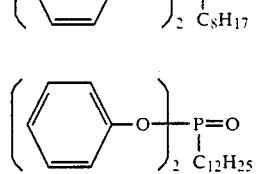 II-28
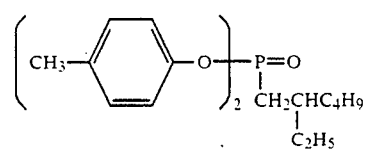 II-29
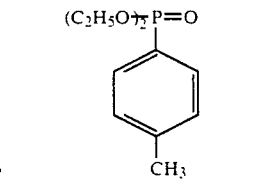 II-30
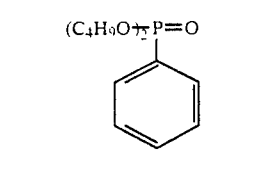 II-31
 II-32

-continued
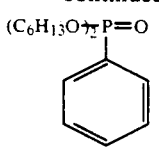
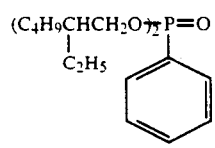
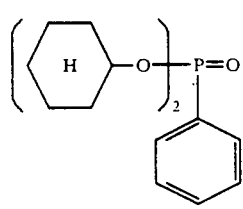
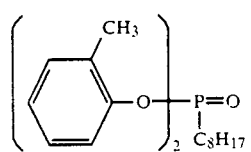
II-37
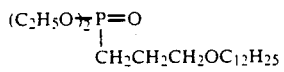
II-38
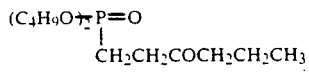
II-39
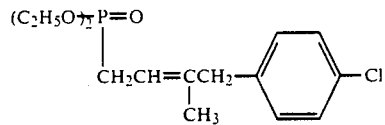
II-40
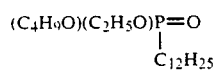
II-41
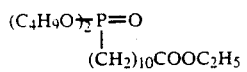
II-42
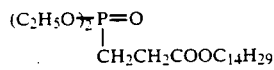
II-43
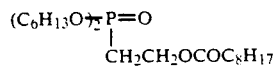
II-44
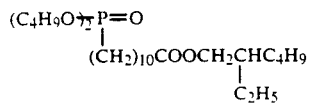
II-45
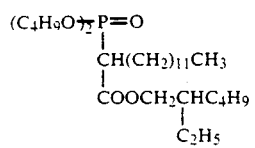
-continued
II-33
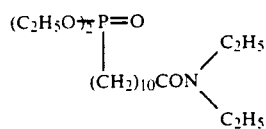
II-34
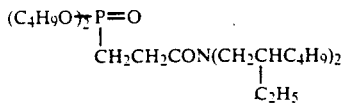
II-35
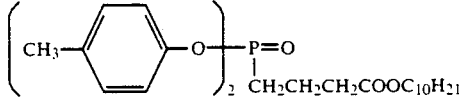
II-36
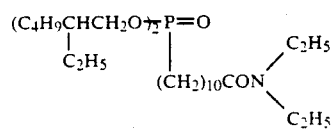
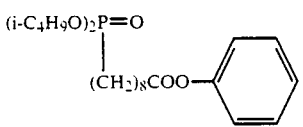  II-50
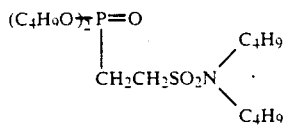  II-51
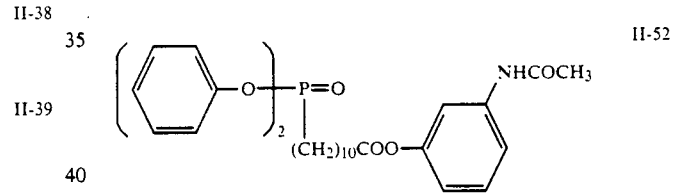  II-52
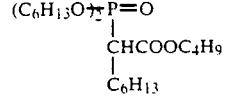  II-53
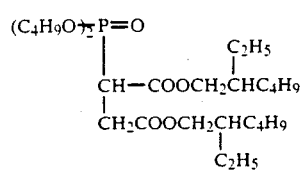  II-54
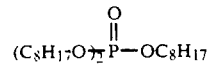  II-55
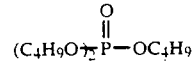  II-56
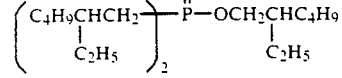  II-57
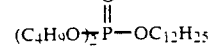  II-58
II-46, II-47, II-48, II-49 labels appear alongside structures above.

-continued
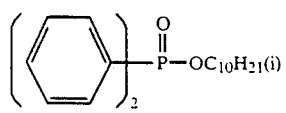
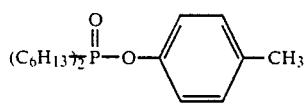 II-60
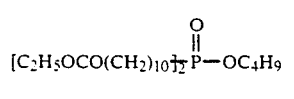 II-61
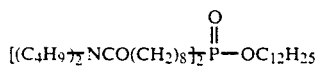 II-62
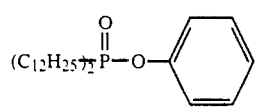 II-63
$(C_2H_5)_3P=O$ II-64
$(C_4H_9)_3P=O$ II-65
$(i\text{-}C_4H_9)_3P=O$ II-66
$(C_5H_{11})_3P=O$ II-67
$(C_6H_{13})_3P=O$ II-68
$(C_8H_{17})_3P=O$ II-69
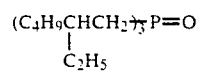 II-70
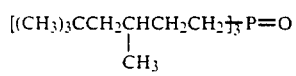 II-71
$(C_{10}H_{21})_3P=O$ II-72
$(i\text{-}C_{10}H_{21})_3P=O$ II-73
$(C_{12}H_{25})_3P=O$ II-74
$(C_{14}H_{29})_3P=O$ II-75
$(C_{17}H_{33})_3P=O$ II-76
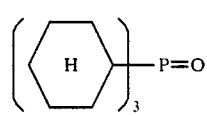 II-77
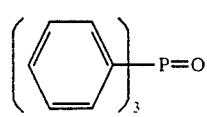 II-78
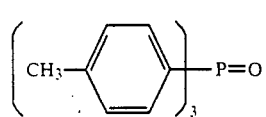 II-79
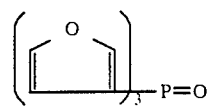 II-80
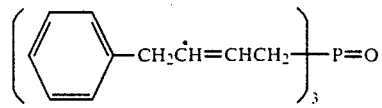 II-81
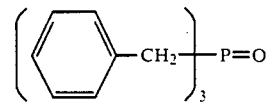 II-82
$[C_4H_9OCO(CH_2)_{10}]_3P=O$ II-83
$[(C_2H_5)_2NCO(CH_2)_{10}]_3P=O$ II-84
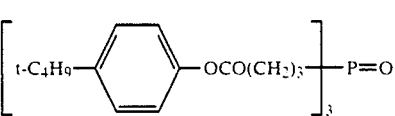 II-85
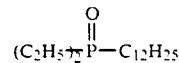 II-86
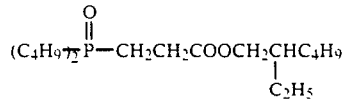 II-87
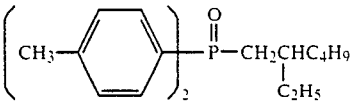 II-88
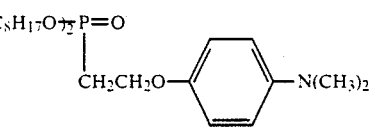 II-89
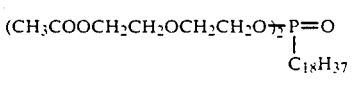 II-90
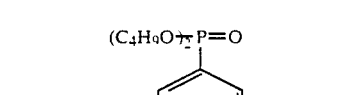 II-91
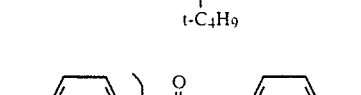 II-92
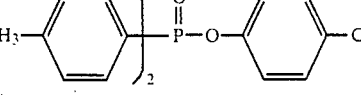 II-93

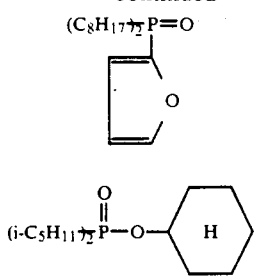

Next, the silver halide emulsions applicable to the light-sensitive layers on the light-sensitive materials of the invention are detailed below.

The silver halide emulsions applicable to the invention include ordinary type silver halide emulsions comprising such silver halides as silver bromide, silver bromoiodide, silver chloroiodide, silver bromochloride, silver chloride and the like.

The silver halide grain composition may be either uniform or different in an inside and a surface layer thereof. In the latter case, the compositions may vary either continuously or discontinuously.

There is no special limitation to a grain size of a silver halide grain. However, taking a rapid processability, sensitivity and other photographic properties into consideration, the grain size is preferably 0 1 to 1.6 $\mu$m, and more preferably 0.2 to 0.8 $\mu$m.

The grain size may be either polydispersed or monodispersed, and preferably monodispersed.

The silver halide emulsions applicable to the invention may be prepared by any of an acid method, a neutral method and an ammonia method. The grains may be grown as they are or grown from the seed grains. The methods of preparing and growing the seed grains may be same or different.

A reaction method of a soluble silver salt and a soluble halide includes any of a normal precipitation method, a reverse precipitation method, a double-jet precipitation method and the combinations thereof. Further, it also includes a pAg-controlled double-jet method disclosed in Japanese Patent O.P.I. Publication No. 54-48521/1979 and so forth, as one of the double-jet precipitation methods.

Further, if required, it is allowed to use a silver halide solvent such as thioether and the like.

Any configurations of silver halide grains may be used. The silver halide grains may be of a single configuration or a mixture of grains having various configurations.

In the course of forming and/or growing silver halide grains, metal ions can be added to a silver halide emulsion applicable to the invention by incorporating into an inside and/or a surface of the grains a cadmium salt, zinc salt, lead salt, thallium salt, iridium salt or a complex salt thereof, rhodium salt or a complex salt thereof, or iron salt or a complex salt thereof, and reduction-sensitive nuclei can also be provided to the inside and/or surface of the grains by placing them in an appropriate reductive atmosphere.

After completing growth of silver halide grains, soluble salts residues may be removed or remain in a silver halide emulsion applicable to the invention. They can be removed according to the method disclosed in Research Disclosure No. 17643.

The latent images may be formed mainly on the surfaces or the insides of the silver halide grains.

The silver halide grains may be chemically sensitized by any of the ordinary methods including a sulfur-sensitizing method using a sulfur-containing compound capable of reacting with silver ions, or an active gelatin; a selenium-sensitizing method using a selenium compound; a reduction-sensitizing method using a reductive substance; a noble metal-sensitizing method using gold or other noble metal compound; and so forth. These sensitizing methods may be used either independently or in combination.

In the case where a silver halide emulsion for forming a direct positive image is used, an internal latent image-forming type emulsion can be used, such as a so-called conversion type silver halide emulsion described in U.S. Pat. No. 3,592,250; a silver halide emulsion containing the silver halide grains subjected to an internal chemical sensitization, described in U.S. Pat. Nos. 3,206,316, 3,317,322 and 3,367,778; a silver halide emulsion comprising silver halide grains containing polyvalent metal ions, described in U.S. Pat. Nos. 3,271,157, 3,447,927 and 3,531,291; a silver halide emulsion comprising silver halide grains which contain a dopant and of which surface is subjected to a weak chemical sensitization, described in U.S. Pat. No. 3,761,276; a core-shell type silver halide emulsion described in Japanese Patent O.P.I. Publication Nos. 50-8524/1975, 50-38525/1975 and 53-2408/1978; a silver halide emulsion described in Japanese Patent O.P.I. Publication Nos. 52-156614/1977, 55-127549/1980 and 57-79940/1982; and so forth. In this case, an internal latent image type silver halide emulsion is preferably of multilayered grains.

Further, there may be added a stabilizer which is ordinarily used to keep a surface sensitivity as low as possible and to provide a lower minimum density and more stable characteristics, such as a compound having an azaindene ring, a heterocyclic compound having a mercapto group, and so forth.

In the light-sensitive material of the invention, the following sensitizing dyes are used to provide at least three silver halide emulsion layers each having a different spectral sensitivity.

The typical examples of a sensitizing dye applicable to a blue light-sensitive silver halide emulsion layer are disclosed in West German Patent No. 929,080, U.S. Pat. Nos. 2,231,658, 2,493,748, 2,503,776, 2,519,001, 2,912,329, 3,656,959, 3,672,897, 3,694,217, 4,025,349 and 4,046,572; British Patent No. 1,242,588, Japanese Patent Examined Publication Nos. 44-14030/1969 and 52-24844/1977; and so forth.

The typical examples of a sensitizing dye applicable to a green light-sensitive silver halide emulsion layer include cyanine dyes, merocyanine dyes and composite cyanine dyes, disclosed in U.S. Pat. Nos. 1,939,201, 2,072,908, 2,739,149 and 2,945,763; British Patent No. 505,979; and so forth.

The typical examples of a sensitizing dye applicable to a red light-sensitive silver halide emulsion layer include cyanine dyes, merocyanine dyes and composite cyanine dyes, disclosed in U.S. Pat. Nos. 2,269,234, 2,270,378, 2,442,710, 2,454,629 and 2,776,280; and so forth.

Further, the cyanine dyes or composite cyanine dyes disclosed in U.S. Pat. Nos. 2,213,995, 2,493,748 and 2,519,001, West German Patent No. 929,080, and so forth can be applied to a green or red light-sensitive silver halide emulsion.

The above-given sensitizing dyes may be used independently or in combination. Such combination thereof is often used particularly for a supersensitization. The typical examples thereof are disclosed in Japanese Patent Examined Publication Nos. 43-4932/1968, 43-4933/1968, 43-4936/1968, 44-32753/1969, 45-25831/1970, 45-26474/1970, 46-11627/1971, 46-18107/1971, 47-8741/1972, 47-11114/1972, 47-25379/1972, 47-37443/1972, 48-28293/1973, 48-38406/-1973, 48-38407/1973, 48-38408/1973, 48-41204/1973, 49-6207/1974, 50-40662/1975, 53-12375/1978, 54-34535/1979 and 55-1569/1980; Japanese Patent O.P.I. Publication Nos. 50-33220/1975, 50-33828/1975, 50-38526/1975, 51-107127/-1976, 51-115820/1976, 51-135528/1976, 51-151527/1976, 52-23931/1977, 52-51932/1977, 52-104916/1977, 52-104917/-1977, 52-109925/1977, 52-110618/1977, 54-80118/1979, 56-25728/1981, 57-1483/1982, 58-10753/1983, 58-91445/1983, 58-153926/1983, 59-114533/1984, 59-11645/1984 and 59-116647/1984; U.S. Pat. Nos. 2,688,545, 2,977,229, 3,397,060, 3,522,052, 3,527,641, 3,617,293, 3,628,964, 3,666,480, 3,672,898, 3,679,428, 3,703,377, 3,769,301, 3,814,609, 3,837,862 and 4,026,707.

Of these sensitizing dyes, the cyanine dye is preferably used for the invention, and is contained preferably in at least one of a yellow image forming layer, a magenta image forming layer and a cyan image forming layer. It is contained more preferably in the yellow image forming layer and at least one of the layers having λmax in a wavelength region deviating by less than 150 nm from that of the yellow image forming layer.

Such sensitizing dyes may be used together with a dye having no spectral sensitization function, or with a material substantially incapable of absorbing visible light and having a supersensitization function, such as a condensation product of aromatic organic acid formaldehyde, described in U.S. Pat. No. 3,473,510; a cadmium salt; an azaindene compound; an aminostyrene compound substituted with a nitrogen-containing heterocyclic ring group, described in U.S. Pat. Nos. 2,933,390 and 3,635,721; and so forth. The combinations described in U.S. Pat. Nos. 3,615,613, 3,615,641, 3,617,295 and 3,635,721 are particularly useful.

Besides the above, the light-sensitive material of the invention may further contain the conventional additives.

Further, the light-sensitive material may also be provided, if required, with various photographic component layers such as a filter layer, an interlayer, a protective layer, a subbing layer, a backing layer, an antihalation layer and so forth, as well as the emulsion layers carrying images thereon. Further, in view of color reproducibility of a magenta image in a region of a highlight to a shadow, it is preferable to provide a filter layer as one of the photographic component layers and/or to incorporate a dye into at least one of the photographic component layers.

Especially, the filter layer is provided preferably in a position further than a magenta image forming layer from a support, and contains preferably a metal colloid as a coloring material.

Any conventional types of supports can be used. The typical examples thereof include baryta paper, paper laminated with polyolefine such as polyethylene, polyethylene terephthalate film into which a white pigment is kneaded, and so forth.

The light-sensitive material of the invention comprises at least three light-sensitive layers each having a different spectral sensitivity, wherein one layer is a blue-sensitive layer; another one is a green sensitive layer which is provided with a maximum sensitivity to green light by a sensitizing dye; and the rest is a red-sensitive layer which is provided with a maximum sensitivity to red light by a sensitizing dye. The respective spectral sensitivities are preferably such that color mixing takes place less often when preparing a color proof from a plural of B/W halftone dot images by exposing them to several kinds of light each having a different spectral distribution.

As follows are shown several examples of the combinations of λmax corresponding to such light-sensitive layer constitution as described above.

| | λmax of spectral absorption | |
|---|---|---|
| Blue image layer | Green image layer | Red image layer |
| 470 nm | 550 nm | 650 nm |
| 470 nm | 550 nm | 700 nm |
| 450 nm | 550 nm | 700 nm |
| 470 nm | 590 nm | 700 nm |
| 550 nm | 470 nm | 660 nm |
| 660 nm | 470 nm | 550 nm |
| 470 nm | 650 nm | 800 nm |

The light-sensitive materials of the invention are exposed to light in a spectral region to which the respective emulsion layers are sensitive. The light sources include natural light (sunlight), a tungsten lamp, a fluorescent lamp, a mercury lamp, a xenon arc lamp, a carbon arc lamp, xenon flash lamp, a cathode ray tube flying spot lamp, various laser beams, a light emitting diode, light emitted from a phosphor excited by electron beam, X-ray, γ-ray, α-ray and the like.

The light-sensitive material of the invention may be comprised of a blue-sensitive, green-sensitive and red-sensitive layers like an ordinary type color paper, and a three color separation filter may be used as an optical filter, such as Wratten filters Nos. 25, 29, 58, 61, 47B, 98 and 99.

In the light-sensitive material of the invention, an image is formed preferably in the presence of a fluorescent whitening agent. The fluorescent whitening agent may be incorporated into the light-sensitive material or contained in the processing solutions, preferably in a color developing solution.

The color developing agents applicable to the invention include those which are well known and used widely in various color photographic processes.

These developing agents include the aminophenol type and p-phenylenediamine type derivatives. Because of more stability than in a free state, these compounds are usually used in a salt form, for example, in a form of hydrochloride or sulfate. These compounds are usually used in an amount of about 0.1 to 30 g per liter of a color developer, and more preferably about 1 g to 15 g.

The above-mentioned aminophenol type developing agents include o-aminophenol, p-aminophenol, 5-amino-2-oxytoluene, 2-amino-3-oxytoluene, 2-oxy-3-amino-1,4-dimethylbenzene, and so forth.

The particularly useful aromatic primary amine type color developing represented by Formula III is N,N-dialkyl-p-phenylenediamine type compound, provided that the alkyl and phenyl groups may be substituted or non-substituted.

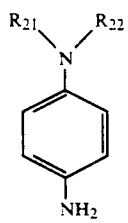

Formula III wherein $R_{21}$ and $R_{22}$ represent independently an alkyl group, provided that $R_{21}$ and $R_{22}$ may be same or different and combine with each other to form a ring.

In the developer represented by Formula III, one of $R_{21}$ and $R_{22}$ comprises preferably a water soluble group, and more preferably $R_{21}$ is an unsubstituted alkyl group, and $R_{22}$ is a hydroxyalkyl group. The preceding water soluble group includes:

—$(CH_2)_n$—$CH_2OH$,
—$(CH_2)_m$—$NHSO_2$—$(CH_2)_n$—$CH_3$,
—$(CH_2)_m$—$O$—$(CH_2)_n$—$CH_3$,
—$(CH_2CH_2O)_nC_mH_{2m+1}$,
—$COOH$,
—$SO_3H$ wherein m and n represent independently an integer of not less than 0.

As follows are shown the examples of the developer represented by Formula III; which can be applied to the invention.

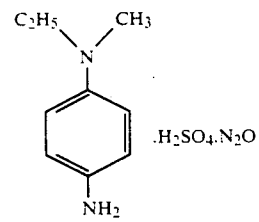 III-1

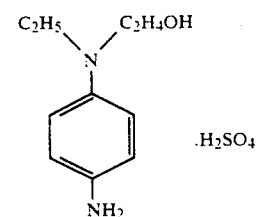 III-2

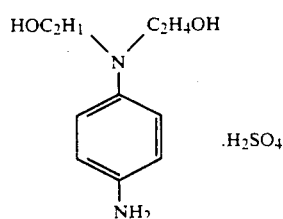 III-3

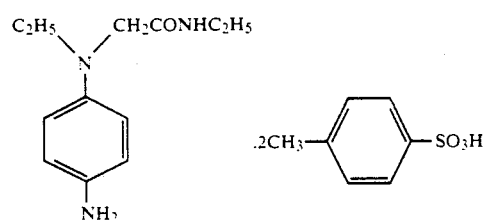 III-4

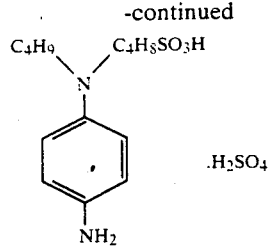 III-5

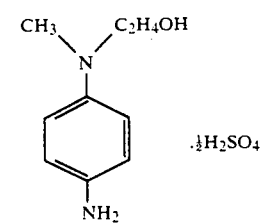 III-6

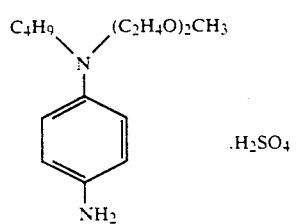 III-7

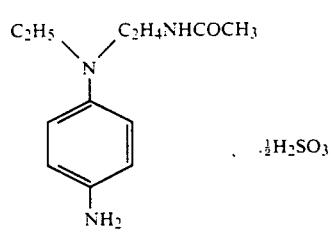 III-8

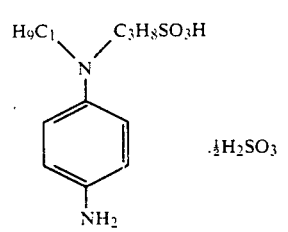 III-9

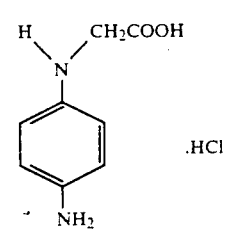 III-10

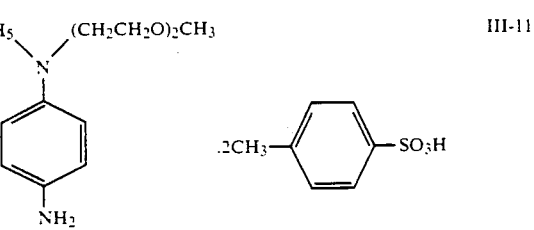 III-11

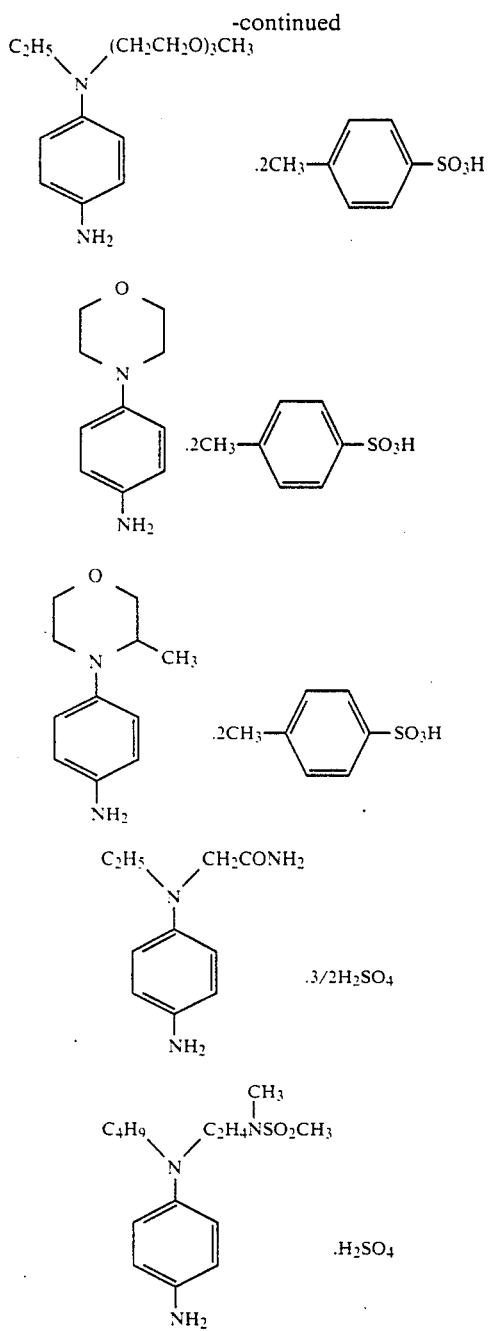

Of the above developers, III-2 is particularly preferably applied to the invention.

The compounds of Formula III applicable to the invention can be synthesized by the method described in J. Am. Chem. Soc. Vol. 73, 3100.

A content of the developer represented by Formula III is preferably not less than 55 mol% of the total developers, more preferably not less than 70 mol%, further more preferably not less than 80 mol%, and most preferably not less than 90 mol%.

An addition amount of the developer in a developing solution is preferably not less than $0.5 \times 10^{-2}$ mol per liter of a developing solution, more preferably $1.0 \times 10^{-2}$ to $1.0 \times 10^{-1}$, and further more preferably $1.0 \times 10^{-2}$ to $2.5 \times 10^{-2}$.

In the invention, any known compounds for the components of developers can be used with the above-mentioned aromatic primary amine type color developing agents. Such developer-component compounds include an alkalizing agent such as sodium hydroxide, sodium carbonate, potassium carbonate and so forth, alkali metal bisulfite, alkali metal thiocyanate, alkali metal halide, benzyl alcohol, a water softening agent, a thickener, and so forth.

A pH value of a color developer is not lower than 7, and generally about 10 to 13.

A color developing temperature is not lower than 15° C., and generally 20° C. to 50° C. A rapid processing is preferably carried out at a temperature of not lower than 30° C. Generally, a color development is carried out in 20 to 180 seconds, and preferably in 30 to 150 seconds.

There also may be treated in an alkaline activation bath the light-sensitive materials of the invention containing the above-mentioned color developing agents as they are or its precursor in a hydrophilic colloidal layer.

In the case where a direct positive image is formed on an internal latent image type light-sensitive material, the light-sensitive material is subjected to surface development after or while being subjected to fogging treatment after an unfogged light-sensitive material is imagewise exposed.

The fogging treatment is carried out by providing an overall and uniform exposure, or by making use of a fogging agent. The overall and uniform exposure is preferably provided to an internal latent image type light-sensitive material after it is dipped in or wet with a developer or other aqueous solutions, and is imagewise exposed. Any light sources are applicable thereto, provided that their wave lengths are within a sensitive region of an internal latent image type light-sensitive material; a high illumination light such as flash light may be applied for a short time, or weaker light for a longer time. An overall and uniform exposure time can be adjusted in a wide range so that an optimum positive image can be ultimately obtained depending upon the characteristics of an internal latent image type light-sensitive material, a development condition, and a type of a light source. Various types of compounds can be used for the above-mentioned fogging agents. They may exist at least in a development process; they may be contained in a silver halide emulsion layer of a light-sensitive material, a developer, or a processing solution applied prior to developing, and preferably in the silver halide emulsion layer. An addition amount thereof can be changed in a wide range by purpose; when incorporating them into a silver halide emulsion layer, it is preferably 1 to 1500 mg per mol of silver halide, and more preferably 10 to 1000 mg; when adding them into a processing solution such as a developer, it is preferably 0.01 to 5 g per liter, and more preferably 0.08 to 0.15 g per liter. The above-mentioned fogging agents include hydroazines described in U.S. Pat. Nos. 2,563,785 and 2,588,982; hydrazid or hydrazone compounds described in U.S. Pat. No. 3,227,552; heterocyclic quaternary nitrogen compounds described in U.S. Pat. Nos. 3,615,615, 3,718,470, 3,719,494, 3,734,738 3,795,901 and so forth; and acylhydrazinophenylthioureas described in U.S. Pat. No. 4,030,925. These fogging agents may also be used in combination. In Research Disclosure No. 15162, for example, there is described a combined use of non-adsorptive and adsorptive fogging agents, and can be applied to the invention. The examples of hydrazine compounds include hydrazine hydrochloride, phenylhydrazine hydrochloride, 4-methylphenylhydrazine gydrochloride, 1-formyl-2-(4-methylphenyl)-hydrazine, 1-acetyl-2-phenylhydrazine, 1-acetyl-2-(4-acetoamidophenyl)hydrazine, 1-methyl sulfonyl-2-phenylhydrazine, 1-benzoyl-2-phenylhydrazine, 1-methylsulfonyl-2-(3-phenyl-sulfonamidophenyl)hydrazine, formaldehyde phenylhydrazine, and the following products;

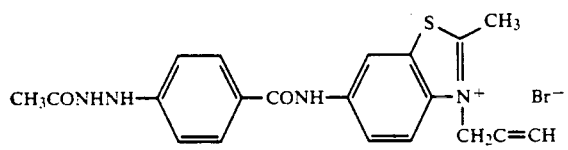

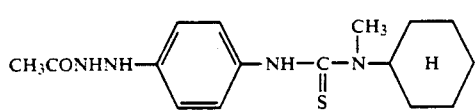

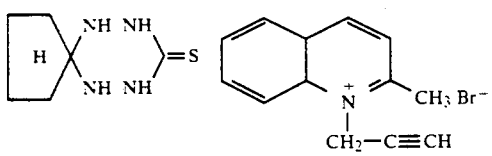

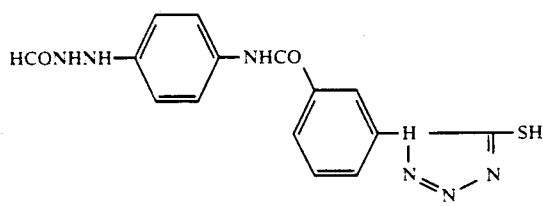

In forming a direct positive image on an internal latent image type light-sensitive material, the light-sensitive material can be developed by any known methods, preferably by a surface treatment method, in which development is carried out by a developer substantially containing no silver halide solvent.

In the invention, a positive image can be formed by subjecting an exposed light-sensitive material to developing and fixing treatments.

The above-mentioned developing treatment includes not only a color development but also a combination of a black-and-white development and a color development like a reversal color treatment. Further, it includes a developing process in which an overall exposure is applied or developing is carried out in the presence of a fogging agent.

The black-and-white developers applicable to a developing process include the primary black-and-white developers applicable to processing of the known light-sensitive materials, and those for processing black-and-white light-sensitive materials. These developers are also allowed to contain various kinds of well known additives used for black-and-white developers.

The typical examples of the additives include a developing agent such as 1-phenyl-3-pyrazolidone, Metol, and hydroquinone; a preservative such as sulfite; a development accelerator such as sodium hydroxide, sodium carbonate, potassium carbonate and so forth; an inorganic or organic development inhibitor such as potassium bromide, 2-methylbenzimidazole, methylbenzthiazole and so forth; a water softening agent such as polyphosphate; a surface over-development inhibitor comprising a small amount of an iodide or mercapto compound; and so forth.

The light-sensitive materials of the invention are subjected to color developing, bleaching and then fixing. The bleaching and fixing treatments may be carried out at the same time.

EXAMPLES

The examples of the invention are detailed below. It is, however, to be understood that the embodiments of the invention shall not be limited thereto.

EXAMPLE 1

Preparation of Emulsion S

Solution A1 and Solution B were simultaneously added stirring to 750 ml of a 2.0% inert gelatin solution maintained at 50° C. for 3 minutes. After ripening the solution for 25 minutes, excessive salts were removed by a precipitation washing method. Then, the emulsion was dispersed once again, and Solution C1 and Solution D1 were added. After 10 minutes, excessive water soluble salts were removed again and a small amount of gelatin was added to disperse silver halide grains.

Preparation of Emulsion L

Solutions A2 and B were simultaneously added stirring to 750 ml of a 1.5% inert gelatin solution maintained at 60° C. for 15 minutes. After ripening for 40 minutes, excessive salts were removed by a precipitation washing method. After the emulsion was dispersed once again, Solutions C2 and D2 were added following 10 mg of hypo. After 10 minutes, excessive water soluble salts were removed again and a small amount of gelatin was added to disperse silver halide grains.

| Solution A1: | Pure water | 2000 ml |
| --- | --- | --- |
| | NaCl | 35 g |
| | NH$_4$Br | 109.6 g |
| | KI | 0.8 g |
| Solution A2: | Pure water | 1000 ml |
| | NaCl | 26.3 g |
| | NH$_4$Br | 109.6 g |
| | KI | 0.8 g |
| Solution B: | Pure water | 1200 ml |
| | AgNO$_3$ | 170 g |
| Solution C1: | Pure water | 1000 ml |
| | NaCl | 60 g |
| | NH$_4$Br | 6.9 g |
| Solution C2: | Pure water | 1000 ml |
| | NaCl | 31.6 g |
| Solution D1: | Pure water | 1000 ml |
| | AgNO$_3$ | 70 g |
| Solution D2: | Pure water | 1000 ml |
| | AgNO$_3$ | 80 g |

A multilayered light-sensitive material was prepared by adding sensitizing dyes, couplers and so forth to the above-mentioned two kinds of emulsions.

Red-sensitive emulsion layer (Layer 1) : to Emulsion S were added Sensitizing dyes D-1 and D-2, Stabilizers T-1 and T-2, Surfactant S-1, and a protective dispersion containing dibutyl phthalate, ethyl acetate, Surfactant S-1, 2,5-dioctyl hydroquinone and cyan couplers CC-1 and CC-2.

First interlayer (Layer 2)

protective dispersion of gelatin was prepared, which contained dioctyl phthalate, 2,5-dioctyl hydroquinone, a UV absorber Tinuvin 328 manufactured by Ciba Geigy AG, and Surfactant S-2, and the gelatin solution was coated so that a coated amount of Tinuvin was 0.15 g/m².

Green-sensitive emulsion layer (Layer 3)

to Emulsion S were added Sensitizing dye D-3, Stabilizers T-1 and T-2, Surfactant S-1, and a protective dispersion containing a high boiling solvent and a magenta coupler shown in Table 1, 2,5-dioctyl hydroquinone, and Surfactant S-2; gelatin and then Hardener H-1 were further added, and the emulsion was coated.

Second interlayer (Layer 4)

a gelatin solution of the same composition as that of the first interlayer was coated, except that a coated amount of Tinuvin 328 was 0.2 g/m².

Yellow filter layer (Layer 5)

a gelatin solution containing yellow colloidal silver prepared by reduction in the presence of an alkaline weak reducing agent, dioctyl phthalate, ethyl acetate, Surfactants S-1 and S-2, 2,5-dioctyl hydroquinone, and Hardener H-1 was coated so that a coated amount of colloidal silver was 0.15 g/m².

Third interlayer (Layer 6)

The same as the first interlayer

Blue-sensitive emulsion layer (Layer 7)

to Emulsion L were added Sensitizing dye D-4, Stabilizers T-1 and T-3, Surfactant S-1, and a protective dispersion containing dibutyl phthalate, ethyl acetate, 2,5-dioctyl hydroquinone, Surfactant S-2 and yellow coupler Y-1; gelatin and then Hardener H-1 were further added, and the emulsion was coated.

Fourth interlayer (Layer 8)

a gelatin solution of the same composition as that of the first interlayer was coated, except that a coated amount of Tinuvin 328 was 0.35 g/m⁴.

Protective layer (Layer 9)

a gelatin solution containing colloidal silica, Coating aid and Hardeners H-2 and H-3 was coated so that a coated amount of gelatin was 1.0 g/m².

The above-mentioned layers from Layer 1 to Layer 9 were coated on a surface treated polyethylene laminated paper by a simultaneous coating method, and dried.

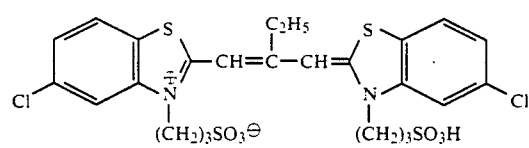

D-1

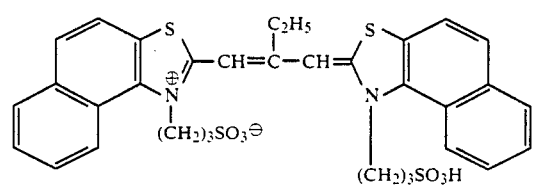

D-2

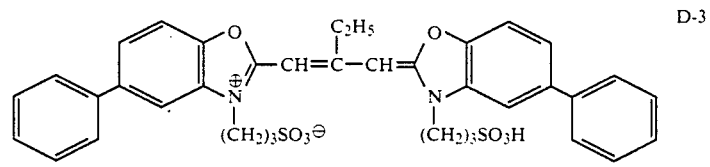

D-3

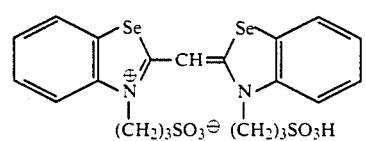

D-4

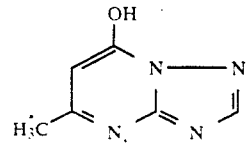

T-1

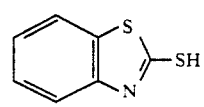

T-2

-continued

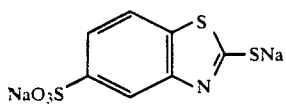 T-3

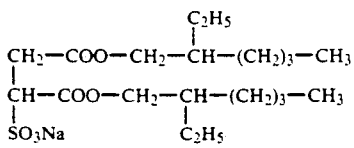 S-1

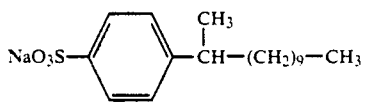 S-2

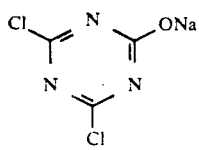 H-1

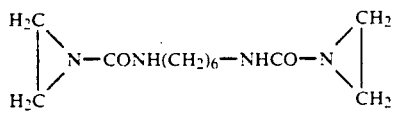 H-2

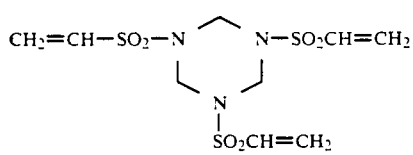 H-3

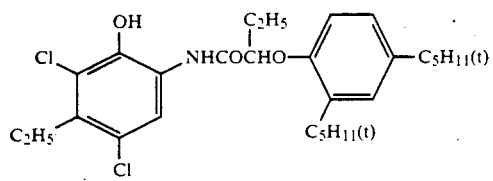 CC-1

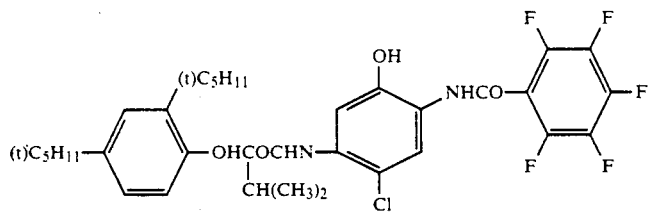 CC-2

The internal latent image type direct positive light-sensitive material was exposed to white light through a red filter (Wratten No. 26) and an ND filter of which density was adjusted to a minimum exposure to obtain a minimum density, of a cyan image, and then it was exposed to white light through a blue filter (Wratten No. 98) and an ND filter of which density was adjusted so that a blue light reflection density of a developed image measured by a densitometer PDA-65 manufactured by Konica Corporation was 0.6. Further, the light-sensitive material was exposed to white light through a green filter (Wratten No. 99) and an ND filter of which density was adjusted so that a green light reflection density of a developed image was 1.6.

The exposed samples ware processed in the following processing steps.

| Processing steps | Temperature | Time |
|---|---|---|
| (1) Dipping (color developer) | 38° C. | 8 sec. |
| (2) Fog-exposing | — | 10 sec at 1 lux |
| (3) Color developing | 38° C. | 2 min. |
| (4) Bleach-fixing | 35° C. | 60 sec. |
| (5) Stabilizing | 25 to 30° C. | 1 min. 30 sec. |
| (6) Drying | 75 to 80° C. | 1 min. |
| Composition of processing solutions | | |
| Color developer | | |
| Benzyl alcohol | | 10 ml |
| Ethylene glycol | | 15 ml |
| Potassium sulfite | | 2.0 g |
| Potassium bromide | | 1.5 g |
| Sodium chloride | | 0.2 g |
| Potassium carbonate | | 30.0 g |
| Hydroxylamine sulfate | | 3.0 g |

-continued

| | |
|---|---|
| Polyphosphoric acid (TPPS) | 2.5 g |
| Developing agent | See Table 1 |
| Fluorescent whitening agent, 4,4'-diaminostilbene sulfonic acid derivative | 1.0 g |
| Potassium hydroxide | 2.0 g |
| Add water to make total quantity | 1 liter |
| Adjust pH to 10.20 | |
| Bleach-fixer | |
| Ferric ammonium ethylenediaminetetraacetate dihydrate | 60 g |
| Ethylenediaminetetraacetic acid | 3 g |
| Ammonium thiosulfate (70% solution) | 100 ml |
| Ammonium sulfite (40% solution) | 27.5 ml |
| Adjust pH with potassium carbonate or glacial acetic acid to pH 7.1 | |
| Add water to make total quantity | 1 liter |
| Stabilizer | |
| 5-chloro-2-methyl-4-isothiazoline-3-one | 1.0 g |
| Ethylene glycol | 10 g |
| 1-hydroxyethylidene-1,1-diphosphonic acid | 2.5 g |
| Bismuth chloride | 0.2 g |
| Magnesium chloride | 0.1 g |
| Ammonium hydroxide, (28% aqueous solution) | 2.0 g |
| Sodium nitrilotriacetate | 1.0 g |
| Add water to make total quantity | 1 liter |
| Adjust pH with ammonium hydroxide or sulfuric acid to pH 7.0 | |

The stabilizing step was carried out in a dual tank with a counter-current system.

A spectral absorbance of a magenta image of a processed sample was measured with a spectrophotometer Model 320 manufactured by Hitachi Ltd. equipped with an intergrating sphere to obtain a $\lambda LO.2$ and $\lambda max$. $\lambda LO.2$ and $\lambda max$ were measured by the method described in pages 7 to 8. Color suitability for a color proof was visually evaluated in terms of an approximation of a hue compared with that of a printed image. The results thereof are shown in Table 1.

TABLE 1

| Sample No. | Magenta coupler and amount added (g/m²) | High boiling solvent and amount added (g/m²) | Developing agent and amount added (g/l) | $\lambda Lo.2$ (nm) | $\lambda max$ (nm) | Color suitability for color proof |
|---|---|---|---|---|---|---|
| 1 (Comparison) | MC-1 (0.7) | HBS-1 (0.7) | A (5.5) | 642 | 532 | x |
| 2 (Comparison) | MC-1 (0.7) | II-67 (0.7) | B (5.0) | 636 | 528 | x |
| 3 (Invention) | M-1 (0.6) | II-22 (0.6) | B (5.0) | 603 | 535 | o |
| 4 (Invention) | M-3 (0.6) | II-4 (0.9) | B (5.0) | 602 | 536 | o |
| 5 (Invention) | M-17 (0.6) | II-4 (0.9) | B (5.0) | 602 | 537 | o |
| 6 (Invention) | M-21 (0.7) | II-4 (1.0) | A (5.5) | 618 | 538 | Δ |
| 7 (Invention) | M-22 (0.7) | II-69 (0.7) | A (5.5) | 615 | 543 | Δ |
| 8 (Invention) | M-25 (0.7) | II-69 (1.4) | A (5.5) | 611 | 538 | o-Δ |
| 9 (Invention) | M-31 (0.7) | II-68 (0.7) | A (5.5) | 614 | 542 | Δ |
| 10 (Invention) | M-33 (0.7) | HBS-2 (0.7) | B (5.0) | 609 | 537 | o |
| 11 (Invention) | M-37 (0.7) | HBS-3 (0.7) | B (5.0) | 607 | 535 | o |
| 12 (Invention) | M-44 (0.7) | HBS-4 (0.7) | B (5.0) | 609 | 538 | o |
| 13 (Invention) | M-61 (0.7) | I-7 (0.7) | B (5.0) | 606 | 539 | o |
| 14 (Invention) | M-65 (0.7) | I-3 (0.7) | A (5.5) | 617 | 544 | Δ |
| 15 (Invention) | M-22 (0.7) | II-69 (0.7) | B (5) | 603 | 537 | o |
| 16 (Invention) | M-22 (0.7) | II-69 (1.0) | A (5.5) | 613 | 542 | o-Δ |

Note:
o . . . Excellent approximation to printed proof
Δ . . . Intermediate of o and x
x . . . Poor approximation due to indefinite color tone

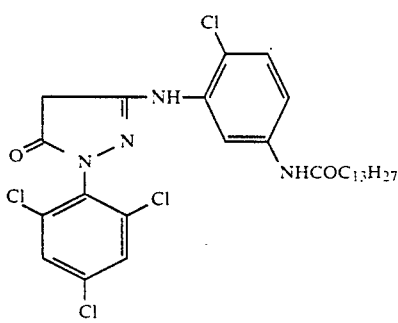

MC-1

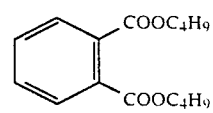

HBS-1

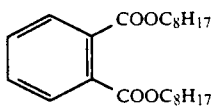
HBS-2

HBS-3 Diethyl laurylamide
HBS-4 Tricresyl phosphate
Developing Agent
3-methyl-4-amino-N-ethyl-N-(β-methanesulfonamidoethyl)-aniline sulfate
Developing Agent
4-amino-N-ethyl-N-hydroxyethyl-aniline sulfate In a light-sensitive material for preparing a color proof from color separated black-and-white halftone dot images, it can be found from Table 1 that an approximation of a hue of a color proof to that of a printed image can be improved when a value of λLO.2 of a spectral absorption of a magenta image is controlled to 600 to 635 nm.

EXAMPLE 2

The following layers were coated in order from the support side to prepare Sample No. 17 (comparison) of a negative type on a paper support having both sides laminated with polyethylene light-sensitive material.

Layer 1 . . . a layer containing 1.2 g/m² of gelatin: 0.32 g/m² (amount converted to silver, hereinafter applied) of a blue-sensitive AgClBr emulsion having an average grain size of 0.8 μm; and 0.80 g/m² of yellow coupler YC-1 dissolved in 0.50 g/m² of dioctyl phthalate Layer 2 . . . an interlayer containing 0.70 g/m² of gelatin; 8 g/m² of irradiation dye AI-1; and 4 mg/m² of AI-2

Layer 3 . . . a layer containing 1.25 g/m² of gelatin: 0.20 g/m² of a green-sensitive AgClBr emulsion having an AgBr content of 70 mol%; and 0.62 g/m² of a magenta coupler MC-1 dissolved in 0.30 g/m² of a high boiling solvent Layer 4 . . . an interlayer containing 1.20 g/m² of gelatin Layer 5 . . . a layer containing 1.20 g/m² of gelatin; 0.30 g/m² of a red-sensitive AgClBr emulsion having an AgBr content of 70 mol%; and 0.45 g/m² of a cyan coupler CC-3 dissolved in 0.20 g/m² dioctyl phthalate Layer 6 . . . a layer containing 1.00 g/m² of gelatin and 0.30 g/m² of a UV absorber UV-1 dissolved in 0.20 g/m² of dioctyl phthalate, and Layer 7 . . . a layer containing 0.50 g/m² of gelatin

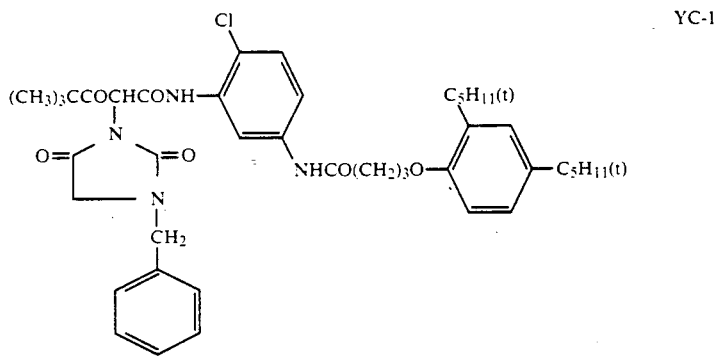
YC-1

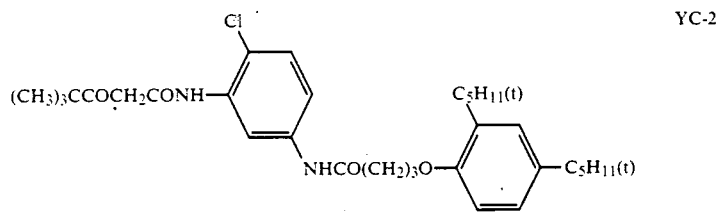
YC-2

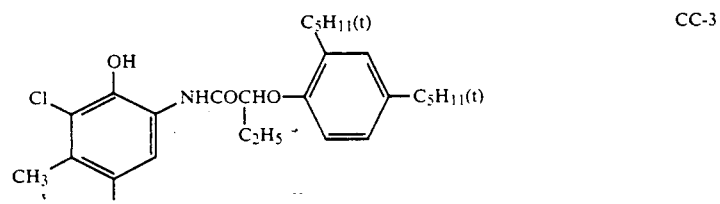
CC-3

AI-1

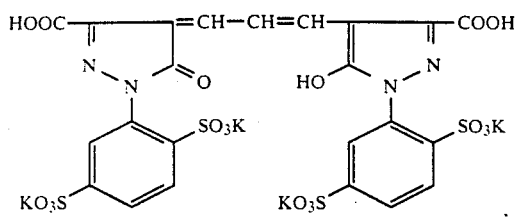
AI-2

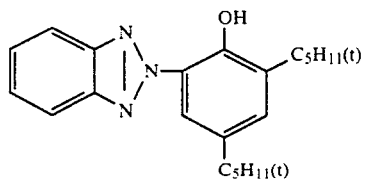
UV-1

Further, sodium 2,4-dichloro-6-hydroxy-s-triazine was added as a hardener to Layers 2, 4 and 7, in an amount of 0.017 g per g of gelatin.

Samples No. 18 (comparison) and No. 19 through No. 32 (invention) were prepared in the same manner as in Sample No. 17, except that the coupler of Layer 3 was replaced with those of Samples No. 2 through No. 16 shown in Table 1.

The respective samples were exposed to green light through an ND filter of which density was adjusted so that a green light density of a developed image was 1.6, and then were exposed to blue light through an ND filter of which density was adjusted so that a blue light density of developed image was 0.6. The exposed samples were processed in the following processing steps.

| Processing steps (35° C.) | |
|---|---|
| Color developing | 1 min. and 1 min. 30 sec. |
| Bleach-fixing | 1 min. |
| Washing | 1 min. |
| Drying | 2 min. (60 to 80° C.) |

The compositions of the processing solutions were as follows.

| Color developer | |
|---|---|
| Pure water | 800 ml |
| Hydroxylamine sulfate | 2.0 g |
| Potassium bromide | 1.5 g |
| Sodium chloride | 1.0 g |
| Potassium sulfite | 2.0 g |
| Triethanolamine | 2.0 g |
| Developing agent, | 1.5 ml |
| 1-hydroxyethylidene-1,1-diphos- | |
| phonic acid (60% aqueous solution) | |
| Potassium carbonate | 32 g |
| Fluorescent whitening agent, | 2 ml |
| Whitex BB (50% aqueous solution) | |
| manufactured by Sumitomo Chemical | |
| Industrial Co., Ltd., | |
| Add water to make total quantity | 1 liter. |
| Adjust pH with a 20% potassium | |
| hydroxide solution or a 10% | |
| sulfuric acid solution to 11.2. | |
| Bleach-fixer | |
| Pure water | 550 ml |
| Iron (III) ammonium ethylene | |
| diaminetetraacetate | 65 g |
| Ammonium thiosulfate | 85 g |
| Sodium hydrogensulfite | 10 g |
| Sodium metabisulfite | 2 g |
| Disodium ethylenediamine- | 20 g |
| tetraacetate | |
| Sodium bromide | 10 g |
| Add pure water to make total | |
| quantity 1 liter. | |
| Adjust pH with aqueous ammonia | |
| or dilute sulfuric acid to 7.0. | |

A spectral absorbance of a processed sample was measured in the same manner as in Example 1 to obtain $\lambda_{LO.2}$, and a color suitability for a color proof was evaluated. The results were very close to those of Example 1.

According to the invention, it is possible to obtain a silver halide color photographic light-sensitive material for color proofing, in which an approximation of a magenta image proof to a printed matter can be improved.

EXAMPLE 4

An emulsion comprising cubic silver bromide grains having an average grain size of 0.3 μm was prepared in such a manner that an aqueous silver nitrate solution and an aqueous potassium bromide solution each of the same mole were added together at the same time in a double-jet method at a temperature of 50° C. over 50 minutes.

An aqueous silver nitrate solution and a mixed aqueous solution of sodium chloride and potassium bromide having a mole ratio of 1:1 were added further to this emulsion at the same time to prepare an emulsion comprising cubic core/shell type silver halide grains having a core of silver bromide and a shell of silver bromochloride with an average grain size of 0.45 μm.

Sample 33 (comparison) having a layer constitution as shown in Table 2 was prepared using the core/shell type silver halide emulsion.

Further, Samples 34 to 42 were prepared likewise by changing a magenta coupler and a high boiling solvent as shown in Table 3.

TABLE-2

| | Composition |
|---|---|
| Sample 33 | Coated amount in a parenthesis; Unit: mg/dm² |
| Back-coat | Gelatin: (53) |
| layer | Colloidal silica: (6.0) |
| Support | Paper support laminated with polyethylene on the both sides, 140 μ thickness |
| Layer 1 | Silver halide emulsion: (3.0) |
| (Red-sensi- | Red-sensitizing dyes: D-3 (45 mg/mol AgX) |
| tive layer) | D-4 (15 mg/mol AgX) |
| | Cyan couplers: CC-1 (3.0) |
| | CC-2 (2.7) |
| | Antistaining agent: AS-2 (0.15) |
| | Solvent: HBS-1 (3.3) |
| | Antiirradiation dye: AI-4 (0.09) |
| | Stabilizers: T-1 (0.6 g/mol AgX) |

TABLE-2-continued

| | Composition |
|---|---|
| | T-2 (0.06 g/mol AgX) |
| | Gelatin: (13.8) |
| Layer 2 (Interlayer) | Antistaining agent: AS-1 (0.55) |
| | Solvent: HBS-2 (0.72) |
| | Gelatin: (7.5) |
| Layer 3 (Green-sensitive layer) | Silver halide emulsion: (4.0)* |
| | Green-sensitizing dye: D-2 (90 mg/mol AgX) |
| | Magenta coupler: See Table-3 |
| | Antistaining agents: AS-1 (0.03) |
| | AS-2 (0.19) |
| | Solvent: See Table-3 |
| | Antiirradiation dye: AI-3 (0.13) |
| | Stabilizers: T-1 (0.6 g/mol AgX) |
| | T-2 (0.06 g/mol Agx) |
| | Gelatin: (13.0) |
| Layer 4 (Interlayer) | Antistaining agent: AS-1 (0.55) |
| | Solvent: HBS-2 (0.72) |
| Gelatin: (5.4) | |
| Layer 5 (Yellow-colloidal layer) | Yellow colloidal silver: (1.05)* |
| | Antistaining agent: AS-1 (0.40) |
| | Solvent: HBS-2 (0.49) |
| | Polyvinyl pyrolidone: (0.47) |
| | Gelatin: (4.2) |
| Layer 6 (Interlayer) | Antistaining agent: AS-1 (0.55) |
| | Solvent: HBS-2 (0.72) |
| | Gelatin: (5.4) |
| Layer 7 (Blue-sensitive layer) | Silver halide emulsion: (4.4)* |
| | Blue-sensitizing dye: D-7 (200 mg/mol AgX) |
| | Yellow coupler: Y-3 (8.2) |
| | Antistaining agents: AS-1 (0.25) |
| | AS-2 (0.25) |
| | Stabilizer: T-1 (0.6 g/mol AgX) |
| | Gelatin: (14.3) |
| Layer 8 (UV-absorbing layer) | UV absorber:UV-1 (0.65), |
| | UV-2 (1.95) |
| | Solvent: HBS-2 (1.0) |
| | Gelatin: (7.8) |
| | Colloidal silica: (0.07) |

*Coated amount converted to silver

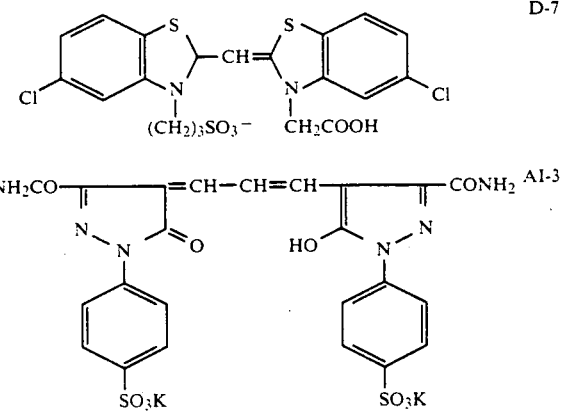

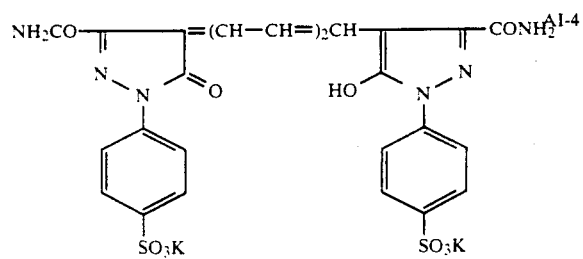

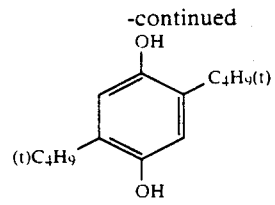

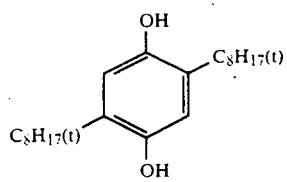

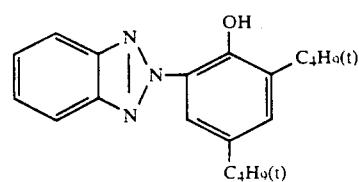

The samples of the internal latent image type direct positive light-sensitive materials thus prepared were exposed to white light through a red filter (Wratten No. 26) and an ND filter by adjusting a density of the ND filter so as to minimize an exposure for obtaining a minimum density of a cyan image formed on the processed light-sensitive material sample.

The exposed light-sensitive material sample was exposed further to white light through a blue filter (Wratten No. 98) and an ND filter by adjusting a density of the ND filter so that a blue light reflection density of the processed sample becomes 0.7.

The foregoing exposed sample was further exposed uniformly to white light through a green filter (Wratten No. 99) and an ND filter by adjusting a density of the ND filter so that a green-light reflection density of the processed sample becomes 1.70.

Next, the exposed sample was brought into close contact with a transparent black-and-white 175-line halftone dot image having a halftone area of 0% to 100% and, was exposed to white light through a green filter and an ND filter by adjusting a density of the ND filter so that a dot gain S with a halftone area of 55.5% on an image of the processed sample becomes 65% to 72%.

The above-mentioned exposed sample was processed in the same manner as in Example-1.

Dot gain S is calculated by the following Malley-Davis Formula:

$$S = \frac{1 - 10^{-(Dr-Do)}}{1 - 10^{-(Ds-Do)}} \times 100 \, (\%)$$

$1 - 10^{-(Dr-Do)}$ wherein

Dr : Reflection density of a halftone dot image,
Ds : Reflection density of a 100% halftone dot area,
Do : Reflection density of a background The above-mentioned reflection densities are those of green light measured with a KONICA Densitometer, Model PDA-65.

On the other hand, a proof print of a 175-line magenta print image having a halftone dot area of 0% to 100 % was prepared so that a dot gain S in a halftone dot area of 55.5% becomes 65 % to 72%.

A hue of a halftone dot image prepared from the above-mentioned light-sensitive material was compared visually with that of a halftone dot image prepared from the proof print in the same halftone dot area.

$\lambda_{LO.2}$ was measured in the same manner as in Example-1.

The results are shown in Table-3.

TABLE-3

| Sample No | Magmeta coupler | High boiling solvent: Amt added mg/dm² | Developing agent: Amt added, g/liter | λL0.2 nm | λmax nm | Color suitability for color proof |
|---|---|---|---|---|---|---|
| Comp. 33 | MC-1 | HBS-1 (4.0) | A (5.0) | 642 | 532 | x |
| Comp. 34 | MC-1 | II-67 (4.0) | A (5.0) | 637 | 530 | x |
| Inv. 35 | M-1 | I-3 (4.0) | A (5.0) | 617 | 544 | o |
| Inv. 36 | M-3 | II-69 (4.0) | B (4.0) | 607 | 539 | ⦿ |
| Inv. 37 | M-21 | II-69 (4.0) | B (4.0) | 604 | 538 | ⦿ |
| Inv. 38 | M-21 | II-69 (4.0) | B (4.0) | 597 | 532 | Δ |
| Inv. 39 | M-22 | II-55 (4.0) | B (4.0) | 605 | 538 | ⦿ |
| Inv. 40 | M-33 | II-70 (4.0) | A (5.0) | 621 | 543 | Δ-o |
| Inv. 41 | M-61 | I-2 (8.0) | B (4.0) | 595 | 531 | Δ |
| Inv. 42 | M-66 | II-69 (4.0) | B (4.0) | 602 | 537 | ⦿ |
| Inv. 43 | M-22 | HBS-3 (4.0) | A (3.0) III-15 (2.16) | 621 | 545 | Δ |
| Inv. 44 | M-22 | HBS-3 (4.0) | A (1.8) III-15 (3.02) | 610 | 540 | o-⦿ |

The color tone approximation grades evaluated stepwise in all the halftone areas:
⦿ ... Especially excellent approximation to printed proof.
o ... Excellent approximation to printed proof.
Δ ... Intermediate of o and x.
x ... Poor approximation due to indefinite color tone.

What is claimed is:

1. A method of preparing a color proof from a silver halide color photographic light-sensitive material having a support and provided thereon, photographic component layers including silver halide emulsion layers each having different spectral sensitivities, and a black-and-white halftone dot image prepared by separating a color from an original, comprising steps of:

exposing said light-sensitive material through said halftone dot image, wherein one of said silver halide emulsion layers comprises a magenta coupler represented by Formula M-I;

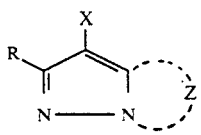

Formula M-I wherein Z represents a group of non-metal atoms necessary to form a nitrogen-containing heterocyclic ring including a substituted one; X represents one selected from the group consisting of a hydrogen atom and a group capable of splitting off upon a reaction with an oxidized product of a developing agent; and R represents one selected from the group consisting of a hydrogen atom and a substituent, developing said exposed light-sensitive material in a developing solution containing a developing agent represented by Formula III in a ratio of not less than 55 mol% to total developing agents, to form at least a magenta image comprising $\lambda_{LO.2}$ of a spectral absorption in a wavelength region of 600 to 630 nm;

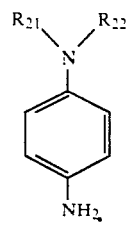

Formula III wherein $R_{21}$ and $R_{22}$ represent independently an alkyl group, provided that $R_{21}$ and $R_{22}$ may be same or different and combine with each other to form a ring.

2. The method of claim 1, wherein said magenta image comprises $\lambda_{max}$ of a spectral absorption in a wavelength region of 530 to 560 nm.

3. The method of claim 1, wherein said light-sensitive material is exposed in sequence with light sources having different wavelengths to which said silver halide emulsion layers are sensitive, through said halftone dot images corresponding to respective colors separated from the original.

4. The method of claim 1, wherein said $\lambda_{LO.2}$ is in a wavelength region of 600 to 620.

5. The method of claim 4, wherein said $\lambda_{LO.2}$ is in a wavelength region of 600 to 610.

6. The method of claim 1, wherein one of $R_{21}$ and $R_{22}$ comprises a water soluble group.

7. The method of claim 6, where $R_{21}$ is an unsubstituted alkyl group, and $R_{22}$ is a hydroxyalkyl group.

8. The method of claim 1, wherein a ratio of said developing agent to the total developing agents is not less than 70 mol%.

9. The method of claim 8, wherein said ratio is not less than 90 mol%.

10. The method of claim 1, wherein a content of said magenta coupler is $1 \times 10^{-3}$ to 1 mol per mol of silver halide.

11. The method of claim 10, wherein said content is $1 \times 10^{-2}$ to $8 \times 10^{-1}$ mol per mol of silver halide.

12. The method of claim 9, wherein a content of developing agent is not less than $0.5 \times 10^{-2}$ mol per liter of a developing solution.

13. The method of claim 12, wherein said content is $1.0 \times 10^{-2}$ to $2.5 \times 10^{-2}$ mol per liter of the developing solution.

14. The method of claim 1 wherein said silver halide color photographic light-sensitive material further comprises at least one high boiling solvent represented by Formula I and II

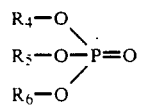  Formula I wherein $R_4$, $R_5$ and $R_6$ independently represent an alkyl group and an aryl group, provided that at least two of $R_4$, $R_5$, and $R_6$ are alkyl groups having not more than 16 carbon atoms;

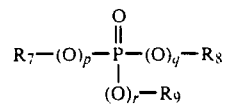  Formula II wherein $R_7$, $R_8$, and $R_9$ independently represent an aliphatic group and an aromatic group; and p, q, and r independently represent 0 or 1 provided that p, q, and r are not all 1 at the same time.

* * * * *